(12) United States Patent
Masson et al.

(10) Patent No.: US 7,966,509 B2
(45) Date of Patent: Jun. 21, 2011

(54) SYSTEM AND METHOD FOR PERFORMING LOW POWER DYNAMIC TRIMMING

(75) Inventors: Eric L. Masson, Fremont, CA (US); Edward S. Ahn, Sunnyvale, CA (US)

(73) Assignee: NVIDIA Corporation, Santa Clara, CA (US)

( * ) Notice: Subject to any disclaimer, the term of this patent is extended or adjusted under 35 U.S.C. 154(b) by 794 days.

(21) Appl. No.: 11/784,268

(22) Filed: Apr. 6, 2007

(65) Prior Publication Data

US 2007/0280034 A1    Dec. 6, 2007

Related U.S. Application Data

(60) Provisional application No. 60/809,636, filed on May 30, 2006.

(51) Int. Cl.
*G06F 1/04* (2006.01)

(52) U.S. Cl. ........................................ 713/500; 713/503

(58) Field of Classification Search ................. 713/500, 713/501, 502, 503
See application file for complete search history.

(56) References Cited

U.S. PATENT DOCUMENTS

| | | |
|---|---|---|
| 5,206,822 A | 4/1993 | Taylor |
| 5,301,136 A | 4/1994 | McMillan, Jr. et al. |
| 5,387,982 A | 2/1995 | Kitaura et al. |
| 5,576,958 A | 11/1996 | Kawakatsu et al. |
| 6,021,420 A | 2/2000 | Takamuki |
| 6,167,092 A | 12/2000 | Lengwehasatit |
| 6,421,695 B1 | 7/2002 | Bae et al. |
| 6,799,192 B1 | 9/2004 | Handley |
| 7,234,069 B1* | 6/2007 | Johnson ........................ 713/400 |
| 2002/0025002 A1 | 2/2002 | Her |
| 2003/0078952 A1 | 4/2003 | Kim et al. |
| 2003/0139913 A1* | 7/2003 | Radcliffe .......................... 703/2 |
| 2004/0066222 A1* | 4/2004 | McWilliams ................. 327/237 |

OTHER PUBLICATIONS

Arnold, "Reduced Power Consumption for MPEG Decoding With LNS", 2002, IEEE Proceedings of the IEEE International Conference on Application—Specific Systems, Architectures, and Processors, pp. 1-11.

* cited by examiner

*Primary Examiner* — Mark Connolly
*Assistant Examiner* — Paul B Yanchus, III

(57) ABSTRACT

A system and method for performing dynamic trimming. Specifically, the system comprises a clock for generating a reference clock signal. The reference clock signal comprises a first frequency that is a factor of a second frequency of a signal (e.g., data clock signal from DDR memory). A counter is coupled to the clock and generates a plurality of clock pulses based on pulses of the reference clock signal. The plurality of clock pulses is generated at a slower frequency from the first frequency for low power operation. A phase length detector is coupled to the counter and comprises a trimmer chain for detecting an average length of at least one of the generated plurality of clock pulses. A transformation module is coupled to the phase length detector for transforming the average length to a phase delay of the signal.

20 Claims, 23 Drawing Sheets

1000C

GENERIC ENCODER BIT
FOR 32X5 ENCODER

GENERIC ENCODER BIT
FOR 64X6 ENCODER

SYSTEM AND METHOD FOR PERFORMING LOW POWER DYNAMIC TRIMMING

CROSS REFERENCE TO RELATED U.S. APPLICATION

This application claims priority to the co-pending provisional patent application, Application No. 60/809,636, entitled "Circuit for Performing Low Power Dynamic Trimming," with filing date May 30, 2006, and assigned to the assignee of the present invention, which is herein incorporated by reference in its entirety.

FIELD OF THE INVENTION

Embodiments of the present invention relate to low power dynamic trimming. More specifically, embodiments of the present invention relate to tracking operations of a chip to produce a delay that is nearly invariant.

BACKGROUND ART

Random access memory (RAM) can be utilized in computer platforms for temporary data storage in main memory. In particular, dynamic RAM (DRAM) memories provide a cost effective solution for system memory. An improvement on DRAM resulted in synchronous DRAM (SDRAM) technology where a synchronous interface is used to access memory data. That is, data from memory is transferred on the rising edge of clock pulses that are synchronous with the computer system bus and processor. In particular, SDRAM transfers one bit (per data line) of data per clock cycle.

An improvement of SDRAM resulted in "Double Data Rate" (DDR) SDRAM technology. Basically, DDR technology doubles the bandwidth, or data rate transfer, of SDRAM. In particular, DDR memories transfers data on both the rising (from low to high) and falling (from high to low) edges of a clock cycle. As such, two bits (per line) of data are transferred for each clock cycle. The evolution of DDR memories resulted in DDR2 memories where the bandwidth, or data rate transfer, of DDR memories is doubled. Moreover, higher data rate transfer can be achieved in DDR2 memories.

DDR memories are sometimes used in low power devices (e.g., LP-DDR, LP-DDR2, etc.). These smaller low power devices (e.g., cell phones, personal digital assistants (PDAs), mobile devices, etc.) greatly benefit from the higher access speeds of DDR technologies while operating under low power conditions.

Two issues greatly influence low power LP-DDR timing. Firstly, LP-DDR read data timing requires the client chip to predict a window in time when return read data is received. Secondly, the client must also delay the return clock strobes so that they can sample data at a stable time. Both problems are usually addressed with tunable delays in the client circuitry. Typical solutions are either static delay chains or delay lock loops (DLLs) whose power consumption is not amenable to the low power market.

Process-voltage-temperature (PVT) variations can greatly affect performance of the LP-DDR memories. PVT variations can become very large. For example, a mobile application may experience extreme temperature variations. That is, in a mobile market, operating conditions can also see a large variance.

In particular, access to data in the DDR memories is implemented through the use of a read strobe (clock) supplied by the DDR memory. The read strobe is closely aligned with the data coming from the memory. That is, the rising and falling edges of the read strobe coincide with the incoming data byte strobes coming from the DDR memory. For example, data is read when the read strobe is switching and a "quse" signal (e.g., a signal indicating that the Q output of the memory is expected to be in use) is high.

However, data cannot be sampled when the data is switching with the read strobe. As such, the read strobe is delayed so that data can be accessed when the data is not switching. In particular, up to a certain frequency, trimmer delays can be done statically by selecting a delay through a fixed and unchanging number of logic cells throughout the course of operation of the device. Additionally, the cell chain is susceptible to PVT variance, and therefore finding a static trimmer value that adapts to all conditions of operation is difficult. For example, mobile applications can experience extreme temperature variations, resulting in large PVT variance. As PVT conditions vary towards the extreme, a static trimmer value will gradually lose its centering property as the delay cells diverge from their nominal delay. As such, reduced operating frequencies are implemented to account for PVT variations.

As previously mentioned, DLLs can be implemented to obtain invariant delays in the read strobe. However, DLLs are known to consume large amounts of power, and therefore may not be suitable for mobile applications which operate under severe low power restrictions. Compared to typical DDR memories, the absence of a DLL on the LP-DDR memories causes a large variance on the return time of read data. Since the tunable delays of the receive circuitry are not matched in the LP-DDR, this requires the circuitry for the tunable delays to be as invariant as possible under all operating condition. However, in low power, mobile DDR applications, the PVT variance is even more pronounced since the tAC timing parameter, common to most DRAM memories, has almost a full clock cycle of variance due to the absence of DLLs.

SUMMARY OF THE INVENTION

A system and method for performing dynamic trimming. Specifically, the system comprises a clock for generating a reference clock signal. The reference clock signal comprises a first frequency that is a factor of a second frequency of a signal (e.g., a data clock signal from a DDR memory). A counter is coupled to the clock and generates a plurality of clock pulses based on pulses of the reference clock signal. The plurality of clock pulses is generated at a slower frequency from the first frequency for low power operation. A phase length detector is coupled to the counter and comprises a trimmer chain for detecting an average length of at least one of the generated plurality of clock pulses. A transformation module is coupled to the phase length detector for transforming the average length to a phase delay of the signal.

BRIEF DESCRIPTION OF THE DRAWINGS

The accompanying drawings, which are incorporated in and form a part of this specification, illustrate embodiments of the present invention and, together with the description, serve to explain the principles of the invention.

DETAILED DESCRIPTION OF THE INVENTION

Figure 1:
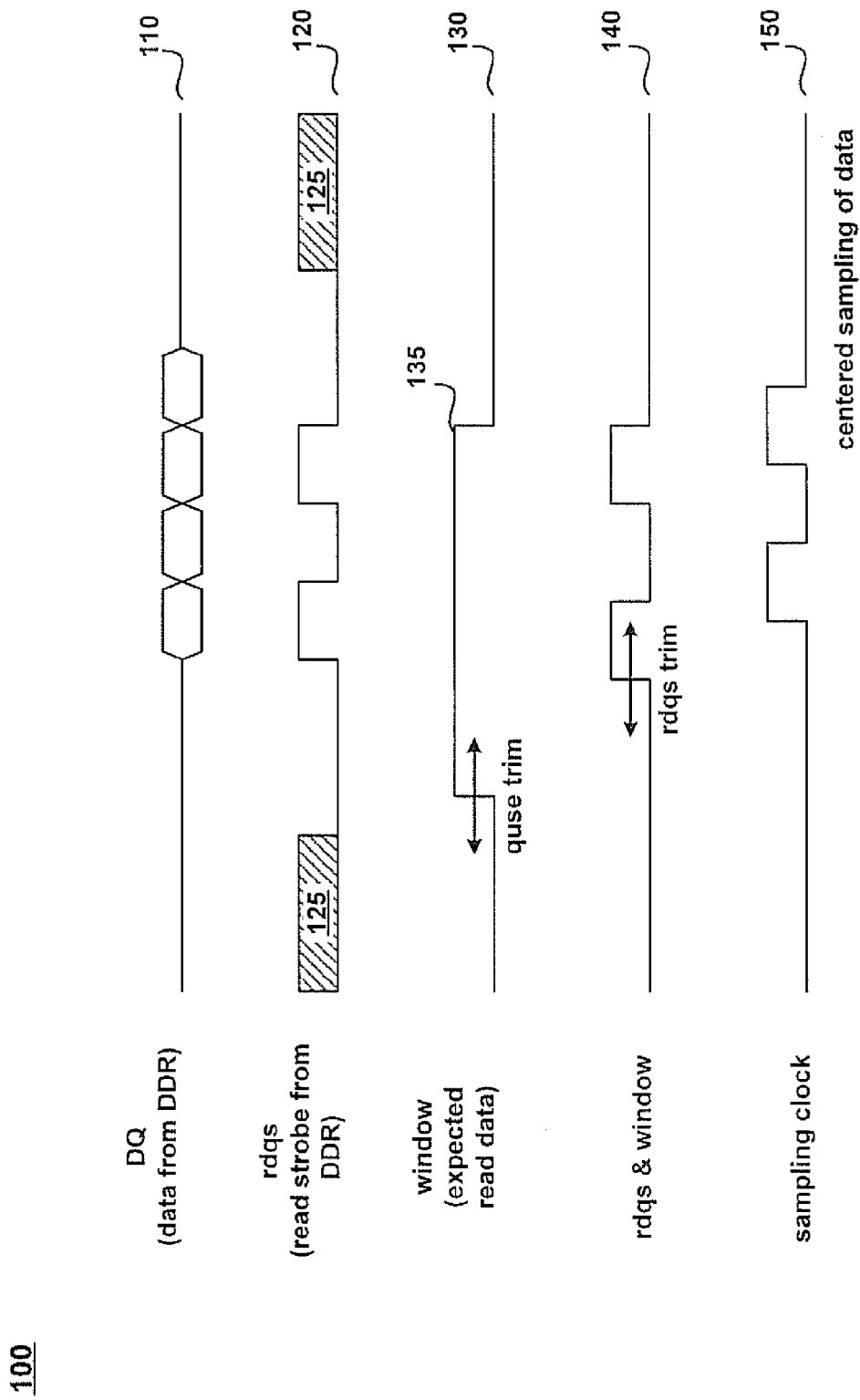
FIG. 1 is a block diagram of waveforms for generating a clock signal, in accordance with one embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Accordingly, embodiments of the present invention provide circuits and methods for performing low power dynamic trimming. The circuits presented provide mechanisms to dynamically track operating conditions of the chip to produce a delay that is near invariant. Low power operation is realized since the circuits operate at an arbitrarily reduced frequency from the frequency of the data clock signal from the DDR memory, in one embodiment. For instance, one embodiment of the present invention operates at $\frac{1}{8}^{th}$ the frequency of the DDR clock. The slow operation frequency of the circuit also makes the design more robust with regard to metastability, while also enabling the use of reduced die areas which consume less power. In addition, the design is scalable because the length of the tuned delay is programmable to a linear transformation of a fixed delay, in one embodiment. Another embodiment is programmable in steps $\frac{1}{64}^{th}$ of the DDR clock period up to an arbitrary length. Other embodiments provide scalability, such that it is possible to generate a tunable window in time at which return read data is expected. Embodiments of the present invention are also scalable in that the granularity in the programmable delay steps is that of a high speed 2 input NAND gate. The circuit of one embodiment also averages out duty cycle distortion found in the reference clock used to produce clock delay. The circuit of another embodiment is also capable to account for differences in propagation between positive and negative edges in the dynamically tunable delay. In other embodiments, the circuit can also filter out jitter on the reference clock by using a longer-term averaging circuit spanning several clock periods. In one embodiment, an average of four samples is used to filter out first order effects.

Low Power Dynamic Trimming

Embodiments of the present invention are capable of providing power dynamic trimming for the LP-DDR (low power dual data rate memory) standard. To read data returning from DDR memory, embodiments of the present invention are capable of delaying the incoming byte strobes (e.g., rdqs0, rdqs1, rdqs2 and rdqs3) so that return read data is sampled under stable conditions. As such, data is sampled when the data is not transitioning. Also, the present embodiment generates an expected window in time when return read strobes are expected to be stable, and thus valid. This ensures that the bidirectional strobes are not used as clocks when the bus read strobes are tristated.

Embodiments of the present invention are described within the context of LP-DDR memories. Other embodiments of the present invention are well suited to implementation using any type of DDR memories. As such, the examples provided herein are implemented within DDR memories, LP-DDR memories, etc.

FIG. 1 is a signal diagram 100 that illustrates the generation of a clock for sampling data from a DDR memory, in accordance with one embodiment of the present invention. In particular, the diagram of FIG. 1 shows the signals used for an LP-DDR client to read returning data in a data signal 110. As shown in FIG. 1, the signal diagram 100 includes a data signal 110, a read strobe signal 120, a window signal 130, a logically AND'ed signal 140, and a shifted read strobe signal 150.

The data signal 110 contains the returning data that is accessed from the DDR memory. The DDR memory also sends a read strobe signal (rdqs) that is closely aligned with the data signal 110. The rdqs signal 120 is a clock used for reading the data from the DDR memory. The rdqs signal 120 also includes a tri-state zone 125 (hash marks) in which the data signal 110 is not read.

The present embodiment generates a self-timed quse signal 130 to determine a valid window 135 when read data is expected to return. In one embodiment, the time position of the window 135 is determined with coarse grain and fine grain knobs. The coarse grain tuning is achieved using sequential elements such as flops, in one embodiment. The fine grain delay tuning is done with a trimmer referenced herein as "quse trimmer", whose name indicates that the Q output of the memory is expected to be in use. The shifting of the strobes is done via a trimmer referenced herein as "rdqs trimmer".

The window 135 in time is used to qualify the read strobes by performing an AND operation on the incoming rdqs strobe 120 with the window 135. This process eliminates tristate zones 125 off the clock. That is, the AND operation is performed on the window signal and the read strobe signal 120 to determine a sampling clock when data can be read from the LP-DDR memory.

In one embodiment, the rdqs trimmer should aim for a delay nearly equivalent to quarter phase of the incoming clock from the DDR memory since that centers rdqs precisely between both edges of data.

The amount of delay applied to the quse window 135 is dependent on the system it is in. In one embodiment, the proper goal can vary between 0 to a quarter phase of the clock, with steps beyond a quarter phase handled in coarse grain trimming using flops. In one embodiment, the window signal is trimmed before performing the AND operation, described above.

In one embodiment, a circuit that performs dynamic trimming is an adaptive method that varies the number of delay cells determined by tracking operating conditions using a stable clock reference. By tracking the operating conditions, the trimmers can keep the rdqs strobes centered even under extreme operating conditions.

Figure 2:
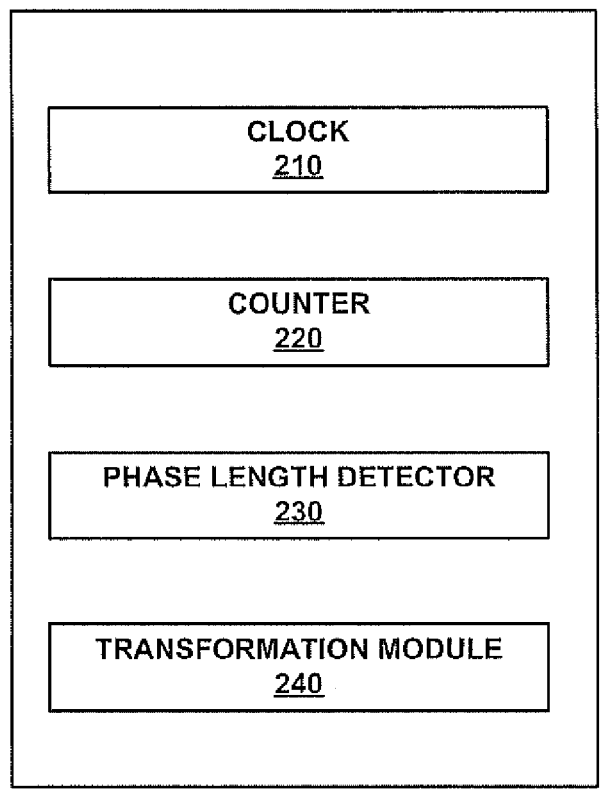
FIG. 2 is a block diagram illustrating a system that is capable of performing dynamic trimming, in accordance with one embodiment of the present invention.

FIG. 2 is a block diagram 200 illustrating a system 200 that is capable of performing dynamic trimming, in accordance with one embodiment of the present invention. The system 200 is capable of dynamically tracking operating conditions of a LP-DDR memory chip in order to produce a delay that is near invariant. The system 200 is used to track the interactions with the LP-DDR memory in order to center the read strobe signals 120 and the quse window 130 of FIG. 1, in accordance with one embodiment of the present invention.

As shown in FIG. 2, the system 200 includes clock 210. The clock (e.g., 210) generates a reference clock signal. In one embodiment, the clock (e.g., 210) generates a reference clock signal of a frequency that is a factor of a period of a signal (e.g., a DDR memory clock signal, a LP-DDR memory clock signal, etc.).

In one embodiment, the frequency of the reference clock signal is faster than the frequency of the data clock signal. For instance, in one embodiment, the reference clock signal is generated from a phase lock loop (PLL) available for accessing the LP-DDR memory. In one embodiment, the frequency of the reference clock signal is faster by a factor of two. The faster reference clock signal is used to produce dual edge output to the LP-DDR memory, for instance. The faster clock has a good duty cycle, since the output of the reference clock signal to the LP-DDR memory needs to be centered with the data clock signal from the LP-DDR memory. In that case, the length of a pulse of the reference clock signal is equal to approximately one quarter of a phase of the data clock signal.

In other embodiments, the frequency of the reference clock signal is equal to or less than the frequency of the data clock signal. In these cases, to accommodate for the slower frequencies, the delay chain circuits implementing the dynamic trimming would be larger than the circuits operating at frequencies faster than the data clock signal.

Also, the system 200 includes a periodic counter 220. The counter is coupled to the clock and generates a plurality of clock pulses that is based on pulses of the reference clock signal. In particular, the counter produces slower frequency clocks used to reduce power consumption. As such, in one embodiment, the plurality of clock pulses is generated at a slower frequency from the frequency of the reference clock signal for low power operation. A more detailed discussion of the periodic counter is provided in relation to FIGS. 8 and 9B.

As shown in FIG. 2, the periodic counter 220 creates periodic events in which the positive phase and the negative phase of pulses of the reference clock are used to estimate delays due to PVT variations. Also, the periodic counter 220 is used to generate positive and negative edges of the plurality of pulses used to estimate the delays. For instance, the pulses used to estimate delays due to PVT variations include the following: a positive phase and positive edge of the reference clock signal; a negative phase and positive edge of the reference clock signal; a positive phase and negative edge of the reference clock signal; and a negative phase and negative edge of the reference clock signal. In one embodiment, the pulses are generated approximately every 16 cycles of the reference clock signal for lower power operation.

In addition, the system 200 includes a phase length detector 230. The phase length detector is coupled to the counter, and is used to detect an average length of at least one of the pulses from the plurality of clock pulses. In one embodiment, the phase length detector comprises a trimmer chain. A more detailed discussion of the phase length detector 230 is included in FIGS. 3A, 3B, and 9C.

The system also includes a transformation module that is coupled to the phase length detector 230. The transformation module transforms the length of a detected pulse to a phase delay of the data clock signal, for example. In this way, process, voltage, and temperature (PVT) variations are taken into account through system 200 by dynamically trimming the data clock signal from the LP-DDR memory.

Figure 3A:
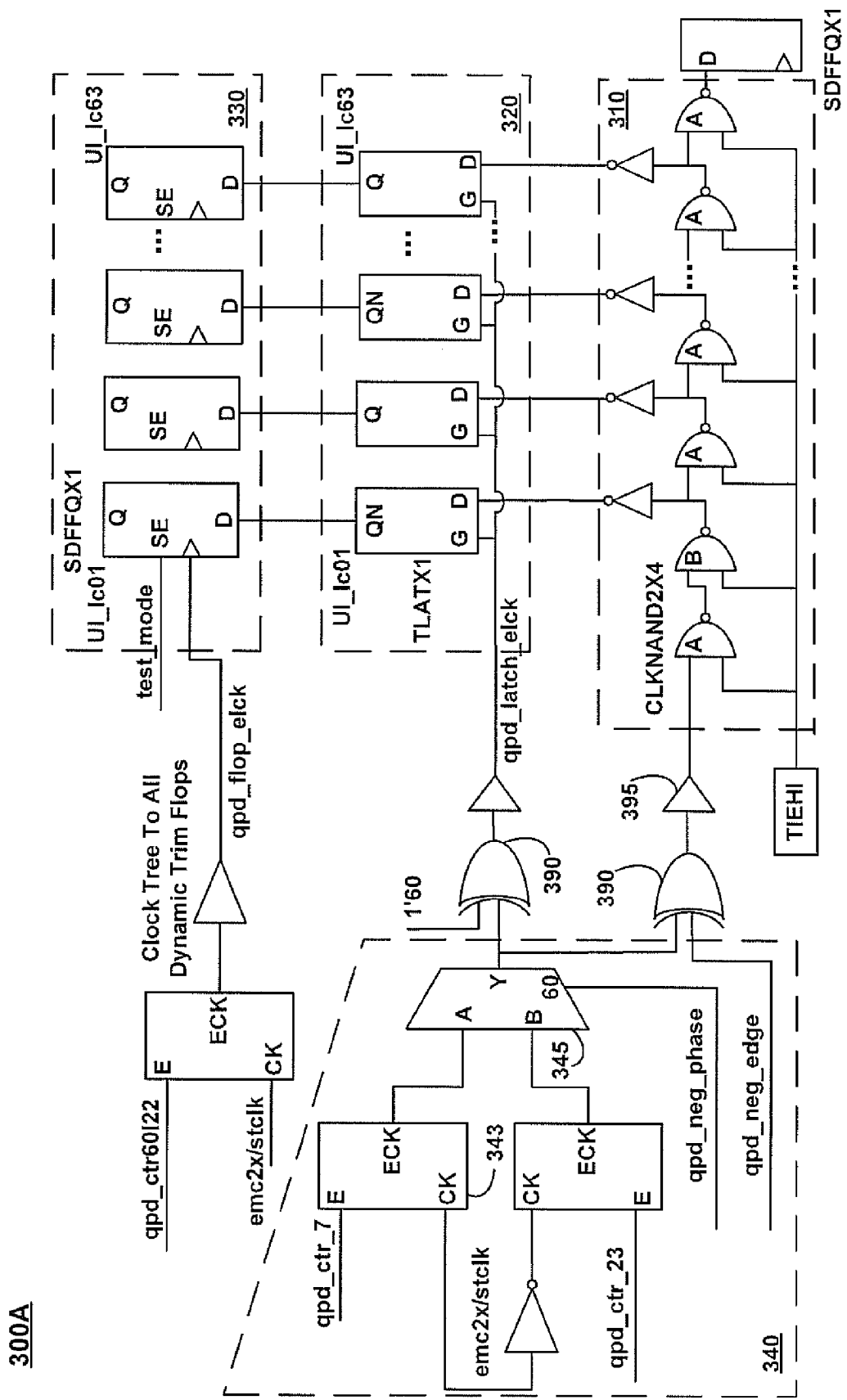
FIG. 3A is a schematic of a phase length detector, in accordance with one embodiment of the present invention.

FIG. 3A is a schematic of a phase length detector circuit 300A, in accordance with one embodiment of the present invention. The phase-length detector circuit 300A is analogous to the phase length detector 230 of FIG. 2. The phase length detector 300 comprises a trimmer 310 that is substantially similar to a trimmer used to trim the data clock signal. In addition, the phase length detector 320 comprises a row of latches 320 for capturing data at each stage of trimmer 310. Also, the phase length detector 320 comprises a row of flip flops 330 that retime the latch content in the row of latches 320 in order to avoid metastability.

In the present embodiment, the delay chain in the trimmer 310 is long enough to exceed half the clock period of the faster clock signal or one quarter of the period of the DDR clock signal. Also, the delay chain must be long enough to accommodate the maximum duty cycle distortion. When a fast clock is used (e.g., the reference clock that operates at twice the frequency of the data clock signal), this implies the delay chain captures a quarter period of the data clock signal from the DDR memory plus the duty cycle distortion. On the other hand, in accordance with another embodiment of the present invention, using the data clock signal from the DDR memory itself would require a delay chain that is twice as long, and would detect half a period of the data clock signal from the DDR memory.

In FIG. 3A, the input block 340 selects the pulse from the counter that is used to determine the length of the pulse, and the corresponding delay applied to the data clock signal. For instance, the multiplexer 345 selects signals between two clock gate latches for one of the plurality of pulses generated by the counter that is based on a reference clock signal. The selected signal is sent simultaneously, and in parallel to the row of latches 320 and the trimmer 310.

As shown in FIG. 3A, the trimmer 310 determines the propagation of a pulse through the delay stages of the trimmer 310. In particular, trimmer 310 comprises 64 delay stages comprising NAND gates, in one embodiment. Inverting buffers are shown coupled to each of the delay stages to replicate the load on the delay states of the trimmer used for delaying a data clock signal. Other embodiments are well suited to more or less delay stages.

In one embodiment, a common signal is applied to each of the delay stages in trimmer 310 (e.g., labeled "TIEHI"). In one embodiment, the common signal may be a high signal.

After the trimmer has reached steady state, the leading edge of the pulse is sent to the stages of the trimmer 310. Thereafter, the trailing edge of the pulse is sent to the stages of the trimmer 310. This sets the length of the pulse between the leading and trailing edges. In one embodiment, the leading and falling edges are positive and negative edges, respectively, of the pulse.

Simultaneously, the row of latches 320 opens on the positive edge of the pulse. Also, the row of latches closes on the negative edge of the pulse. That is, the row of latches 320 captures the state of each of the delay stages.

Since the delay chain in the trimmer 310 consists of alternating inversions, the non-inverted (Q) and inverted (QN) output of the latches in the row of latches 320 are used, in one embodiment. Each time the latch gates are closed, the position of the propagation of the pulse is determined by noting the position at which two neighboring latches have different value. That is, as the leading edge of the pulse propagates through the delay stages, when the latches close, the leading edge will have reached a final delay stage NAND gate with a high value. The next NAND gate delay stage is still reset to the common signal, a low signal. As such, the two neighboring latches have different values.

In one embodiment, if the frequency of the reference clock signal is twice that of the data clock signal, the pulse length indicates a quarter phase of the data clock signal. As such, the position of the quarter phase delay is determined by noting the position at which two neighboring latches have different values.

Figure 3B:
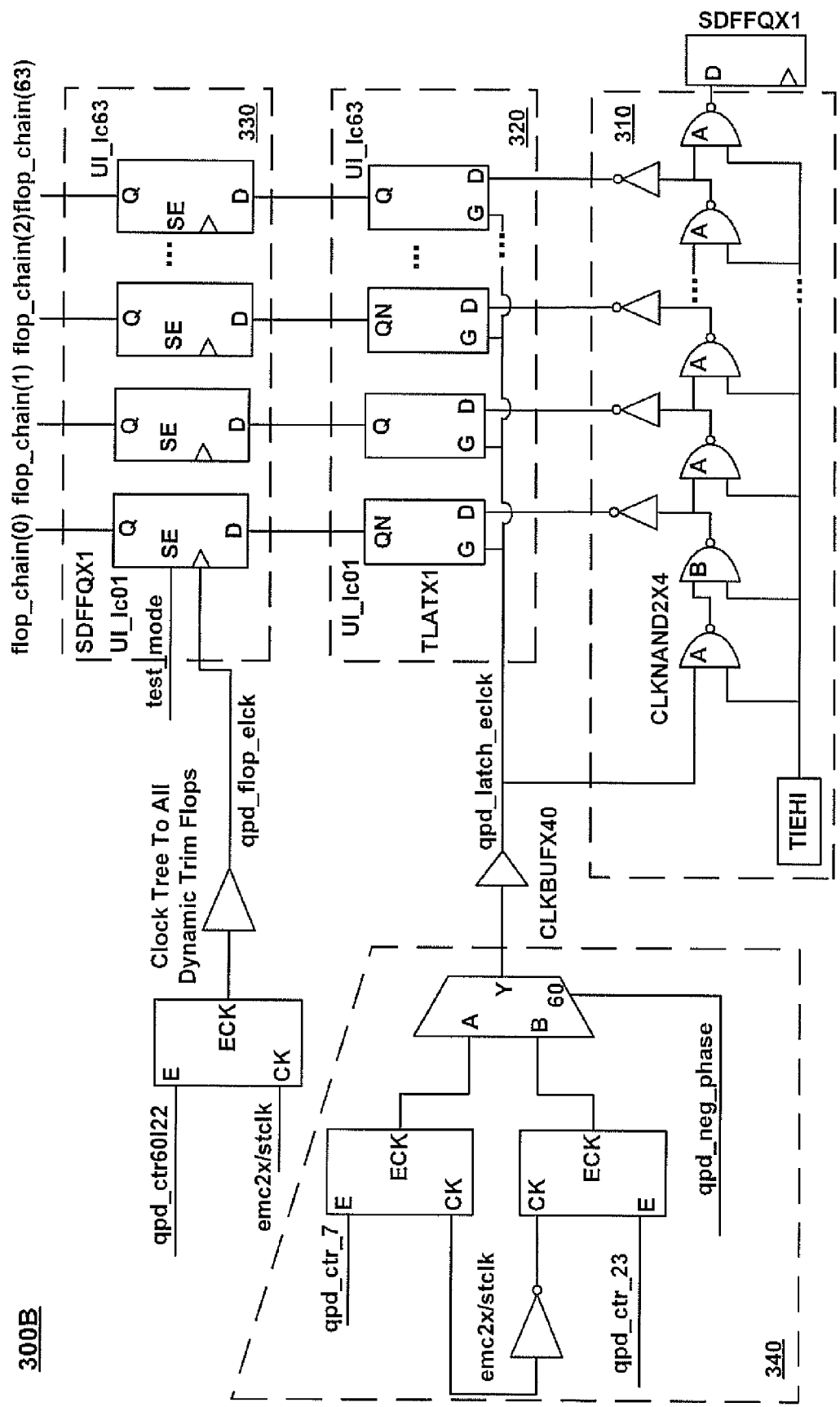
FIG. 3B, is a schematic of a phase length detector that assumes that negative edge and positive edge in the delay chain have near equal propagation delays, in accordance with one embodiment of the present invention.

FIG. 3B is a schematic of a phase length detector circuit 300B, in accordance with one embodiment of the present invention. The phase length detector circuit 300B is analogous to the phase length detector 230 of FIG. 2. Because inversions occur along the phase length detector circuit, the positive edge and the negative edge in the delay chain could have near equal propagation delays. As such, the phase length detector circuit 300B is a simplification of the phase length detector circuit 300A. In particular, the circuit in FIG. 3B does not include the inverter 395 that invert the edges passed on to the delay chain. Also, the circuit in FIG. 3B eliminates the distortion provided in the parallel XOR gates 390 of FIG. 3A. Similarly numbered blocks in FIGS. 3A and 3B are intended to perform similar functions.

In another embodiment, at the cost of more hardware, the phase length detector circuit 300A and 300B could avoid inverting the negative phase and/or multiplexing (e.g., using multiplexer 345) between the latches. This may be accomplished by using a second set of negative phase latches, thereby reducing the need to invert the clock signal and/or multiplex between inverted and non-inverted clock signals.

In one embodiment, taking the average of the last four phase delay values filters out part of the duty cycle distortion of the clock and the delay chain edge distortion. Taking an average of more samples gives a better result as it filters out more jitter. In one embodiment, the averaging is limited to four samples in one embodiment: a positive phase and positive edge of the reference clock signal; a negative phase and positive edge of the reference clock signal; a positive phase and negative edge of the reference clock signal; and a negative phase and negative edge of the reference clock signal. This filters out clock noise due to cycle distortion. For instance, both the positive phase and the negative phase of the clock signal may be considered with a positive edge latch opening and a negative edge latch closure (e.g., as shown in FIG. 9C). Circuit 300A accounts for all possible edge/phase scenarios using only one latch chain. Additionally, to improve clock jitter filtering, samples spanning several clock periods can be averaged at the additional cost of more storage and arithmetic hardware.

In another embodiment, the pulses are generated and delivered in a non-harmonic fashion. This is to reduce jitter that is harmonic to the sampling period. That is, the pulses used for calculating the phase delay is sent in prime number intervals of the cycles of the frequency of the reference clock signal. This is implemented to reduce harmonic jitter.

Figure 4:
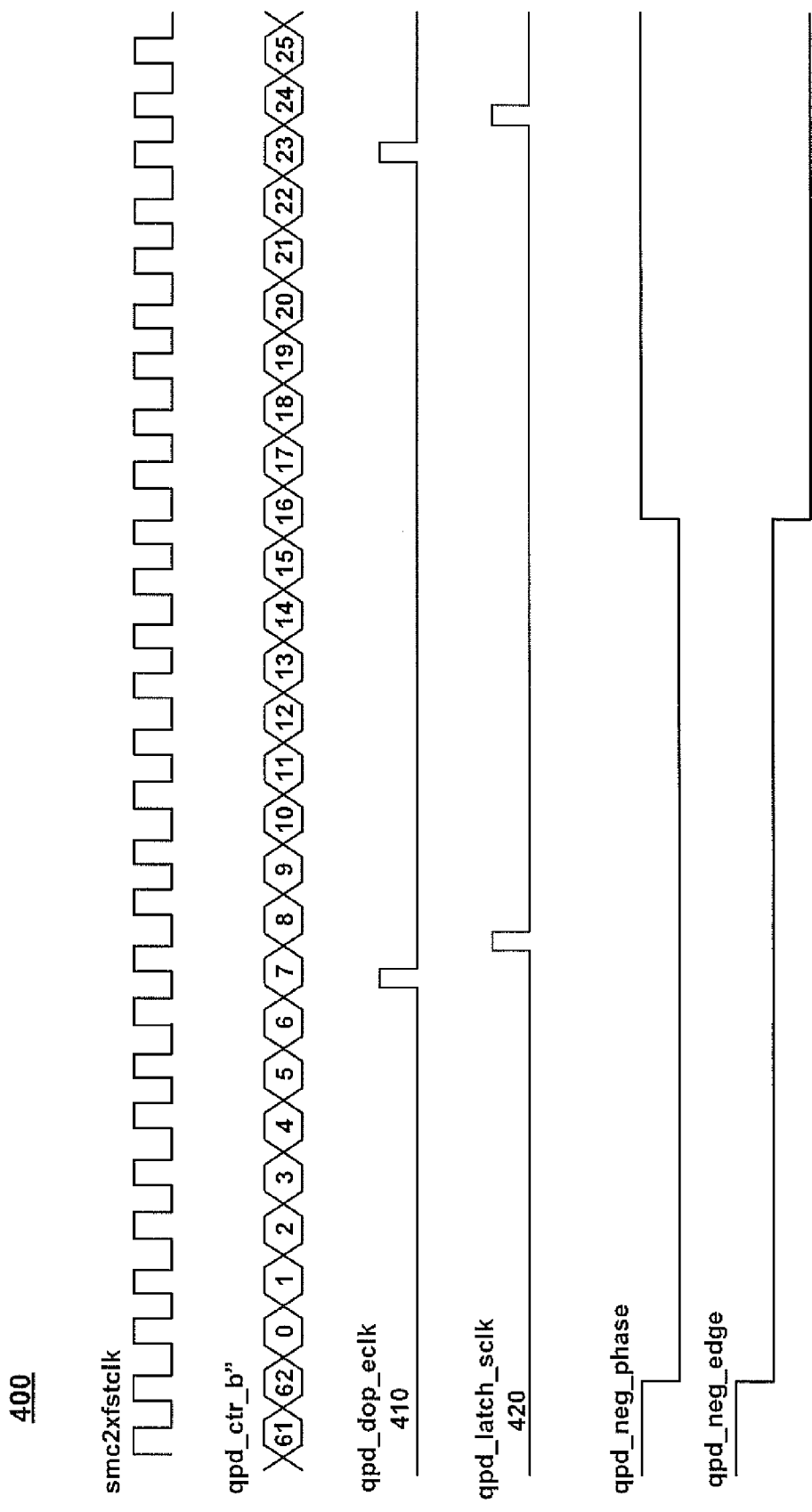
FIG. 4 is a timing diagram illustrating the plurality of clock pulses used to determine the delay applied to a data clock signal, in accordance with one embodiment of the present invention.
Figure 4:
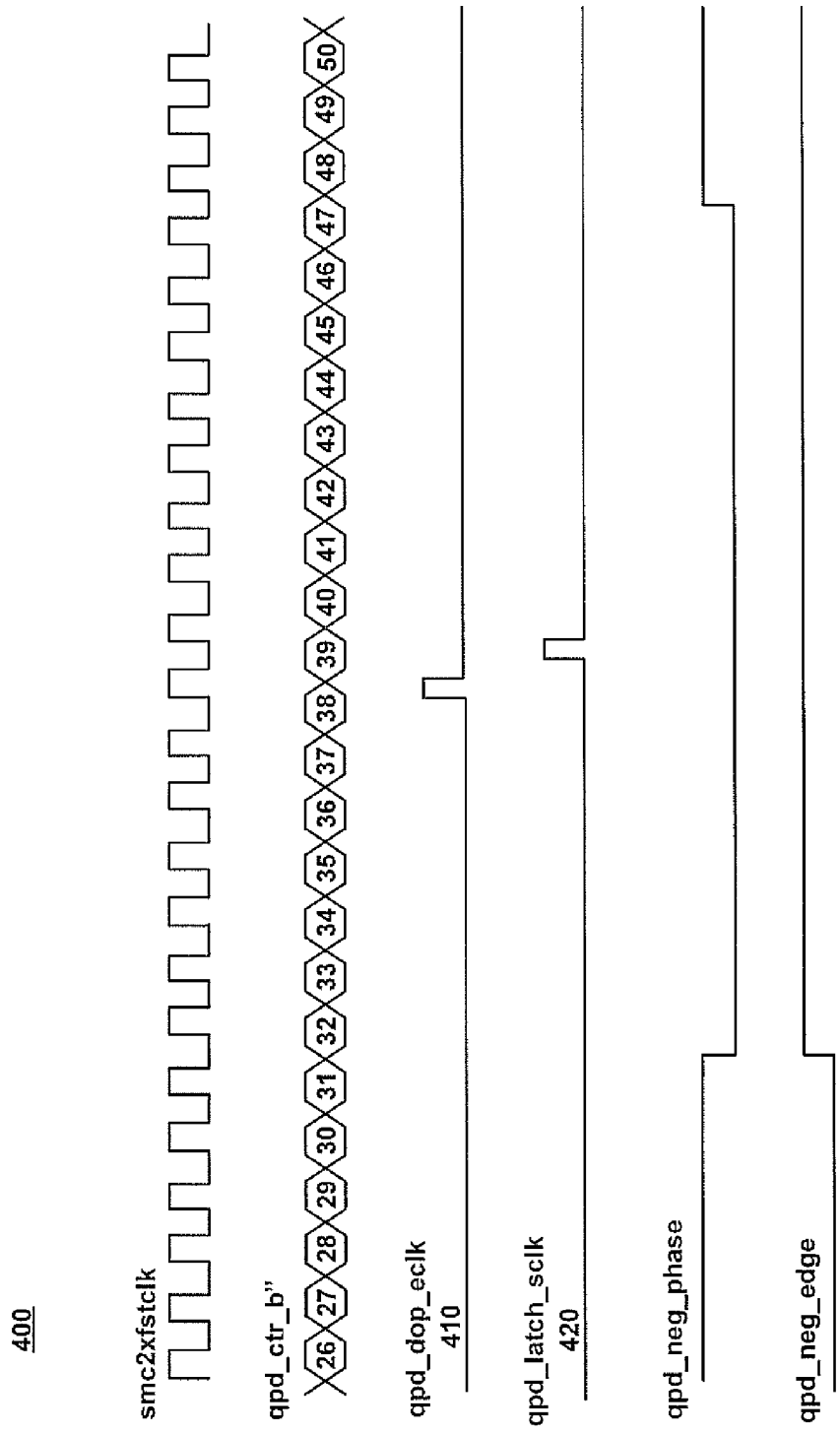

FIG. 4 is a timing diagram illustrating the plurality of clock pulses selectable by the input block 340 used to determine the delay applied to the data clock signal, in accordance with one embodiment of the present invention. As shown, on the count of 7, the clock gate latch 343 passes on the positive phase, positive edge of the clock pulse in the signal 420. On the count of 23, the inverted negative phase, positive edge of the clock pulse is propagated in the signal 420. On the count of 39, the positive phase, negative edge is propagated in the signal 420. On the count of 55, the inverted, negative phase, negative edge is propagated in the signal 420. The purpose of using the positive and negative phases is to compensate for a distorted duty cycle in the reference clock. Also, the purpose of using a positive and negative edge is to compensate for the positive edge and negative edge distortion in the delay chain of the trimmer 310 discussed below. Taking an average of the four cases filters part of these noise sources.

As shown in FIG. 4, the clock signal 410 produces a clock that is used on all of the flops 330 in FIG. 3A. In particular, the signal 410 allows a clock pulse through when the counter reaches 6, 22, 38 and 54 in the present embodiment. From the waveform diagram of FIG. 4, the flop row captures data almost 16 cycles after the latch capture data. This is done in one embodiment since the probability of metastability greatly reduces as the time spent on this sampling interval increases. In another embodiment, the difference is not precisely 16 cycles to avoid any hold time issues between the latches and the flops. Consequently, the rising clock edge at the flops is always at least a half cycle earlier than at the latches.

Figure 5:
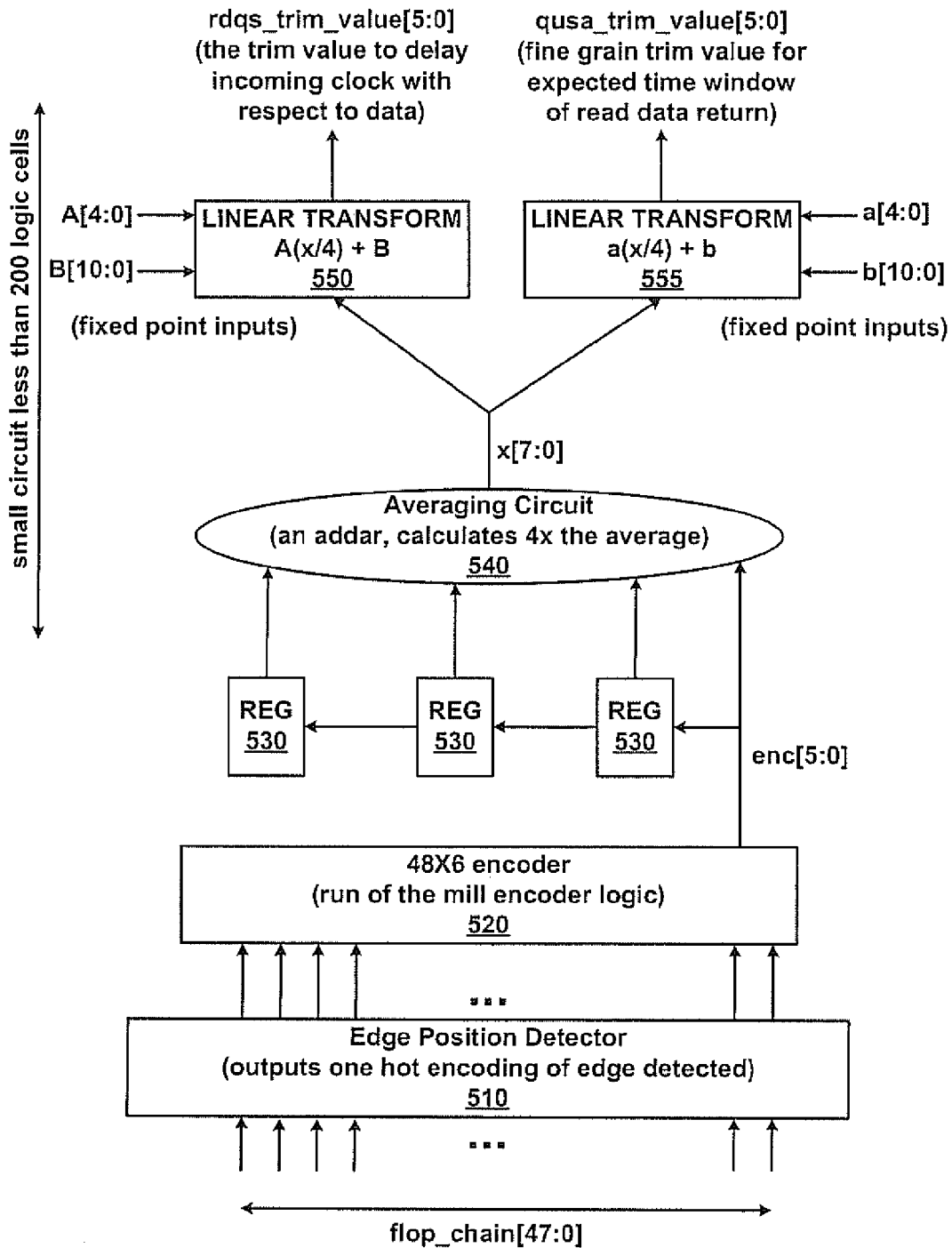
FIG. 5 is a diagram of a system that is capable of calculating phase length, in accordance with one embodiment of the present invention.

FIG. 5 is a flow diagram 500 for transforming a length of a pulse detected from the phase length detectors of FIGS. 3A and 3B into a trimmer setting for use in centering the read strobes (rdqs) and the quse window, in accordance with one embodiment of the present invention.

FIG. 5 shows an example for 48 trimmer selectable positions. As shown, the edge position detector 510 produces a one hot encoding for the position of the edge. This is then translated into a binary encoding by the encoder 520. The current value and the last three values are kept in registers 530, in one embodiment, as previously discussed. The adder circuit 540 takes an average of all the collected values in order to prune out first order noise effects. That is, the adder averages the plurality of lengths determined from the plurality of clock pulses.

A linear transformation of the average value is then performed by the transformation module 550 so that the delay can be synthesized by the trimmers. That is, the average of the lengths of the pulses is transformed into a phase delay of the data clock signal. For instance, in this case, the read strobe, rdqs, delay is calculated. This is the trim value to delay the incoming data clock signal.

In addition, a second linear transformation of the average value is performed by the transformation module 555. In this case, a delay other than a quarter phase (or half phase) can be synthesized by the trimmer. This produces a quse fine trim value for the expected time window of the read data return signal. As discussed earlier, this is especially important for the quse trimming in a mobile environment.

The values of the coefficients "A and a" are multipliers that represent fractions of a clock cycle. In the case of one embodiment, this ranges from 0/64 to 23/64, thereby allowing a slight overshoot of ¼ clock cycle. In one embodiment, the offsets "B and b" are two's complement values ranging from −1024/64 to +1023/64 in units of trimmer positions.

The linear transformation unit (e.g., 550 and 555) also calculates the division by four required for the averaging. The result is the linear transformation is then rounded to the nearest trimmer position. The linear transformation unit result is clamped to 0 if the final result is negative or to the maximum trimmer value if the result exceeds the trimmer length.

Figure 6:
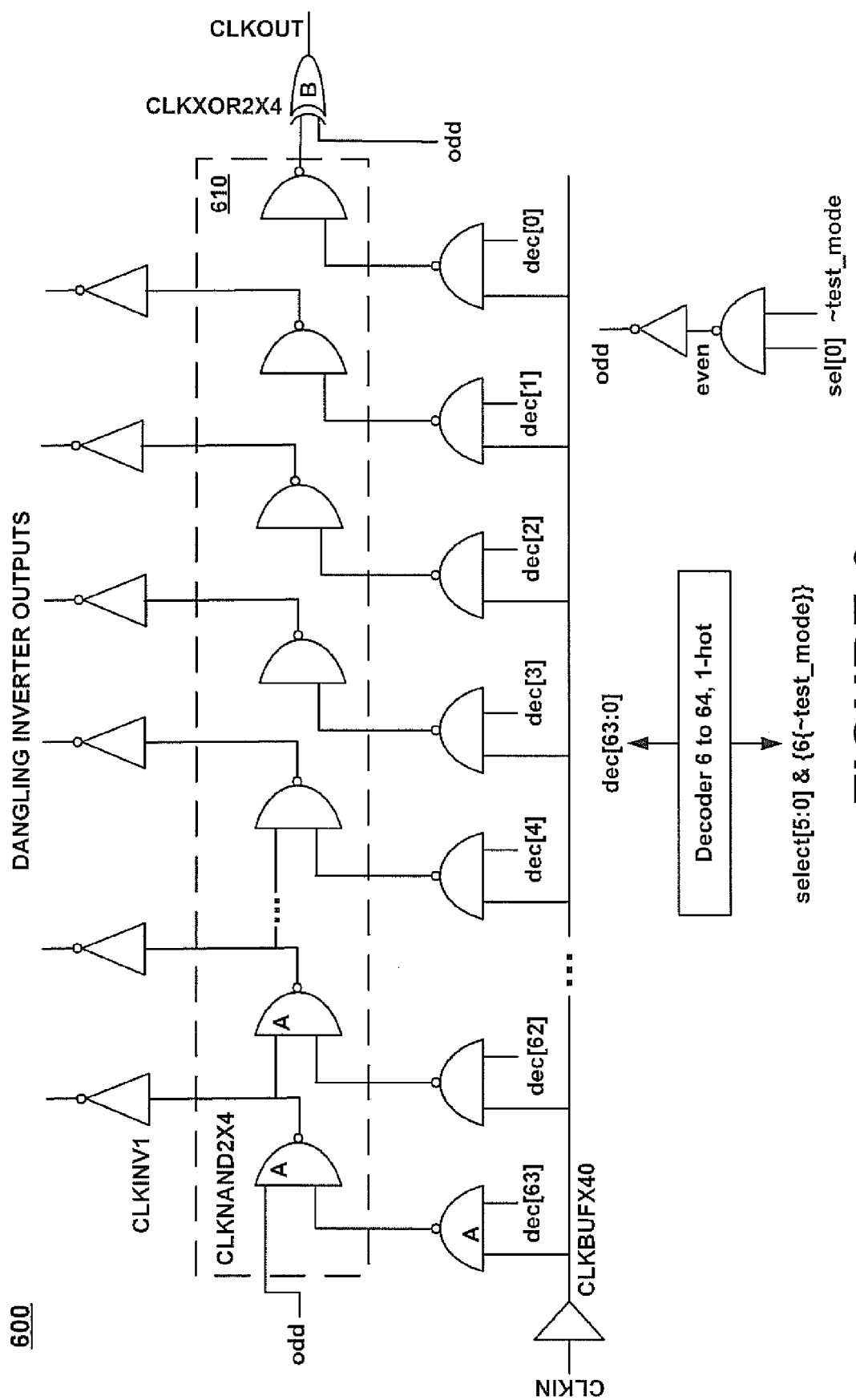
FIG. 6 is a schematic diagram of a trimmer circuit that is used to trim the data clock signal from a DDR interface based on the phase delay calculated by the phase length detector circuits of FIGS. 3A and 3B, in accordance with one embodiment of the present invention.

FIG. 6 is a schematic diagram of trimmer circuit 600 that is used to trim the data clock signal from a DDR interface based on the phase delay calculated by the phase length detector circuits of FIGS. 3A and 3B, in accordance with one embodiment of the present invention. Trimmer circuit 600 comprises delay chain 610, where delay chain 610 comprises a plurality of inverting NAND gates. The length of delay chain 610 of trimmer circuit 600 may be dynamically programmed by selecting or enabling a plurality of trimmer tap points (e.g., labeled "dec[x]," where "x" represents a trimmer stage number), where each trimmer tap point may comprise an NAND gate. In one embodiment, the length of delay chain 610 may range from 2 to 65. Additionally, in one embodiment, the length may be dynamically updated in response to PVT variations.

As shown in FIG. 6, the input CLKIN goes through the dynamically selected number of stages of delay chain 610. The length of the trimmer can be made arbitrary, provided the decode value is wide enough. Depending on the trimmer length, an odd or even signal needs to be input at the beginning and the end of the chain as shown in the diagram.

The input at the beginning of delay chain 610 can be an odd signal if the number of trimmer stages, or tap points, is divisible by 2. As shown in FIG. 6, delay chain 610 comprises 64 stages, so an odd signal is input at the beginning of delay chain 610. However, if the number of selected stages is not divisible by two, then an even signal may be input at the beginning of delay chain 610.

As shown in FIG. 6, the small dangling inverters mimic capacitance found in the inverters of the phase length detector 310 of FIG. 3A where delays are evaluated dynamically. Each stage of the NAND chain is inverting, so the rise and fall delay difference at the CLKOUT output is very small, therefore being of good quality for a DDR system. It is important that each NAND gate in the delay stages of the trimmer circuit 600 see the same dummy inverter so that all gates see the same capacitance under rise and fall circumstances.

The trimmer circuit 600 can dynamically change select values when the input CLKIN is 0. The trimmer values, either rdqs or quse, cannot be changed when the rdqs strobe is passing through. In one embodiment, a DDR interface has guaranteed period of time at regular intervals when no strobes are generated. This occurs when refreshes are issued to the memory. In another embodiment, it is quite rare that a memory interface is utilized at 100% of its capacity. Therefore reads are not always occurring, even outside of refresh. As such, continuous updating of trimmer values occurs during opportunities when no read data is expected back with a minimum guarantee of update opportunities at periodical refresh cycles. When the interface is not expecting read data back, the input to the trimmer is expected to be zero in both cases.

Figure 7:
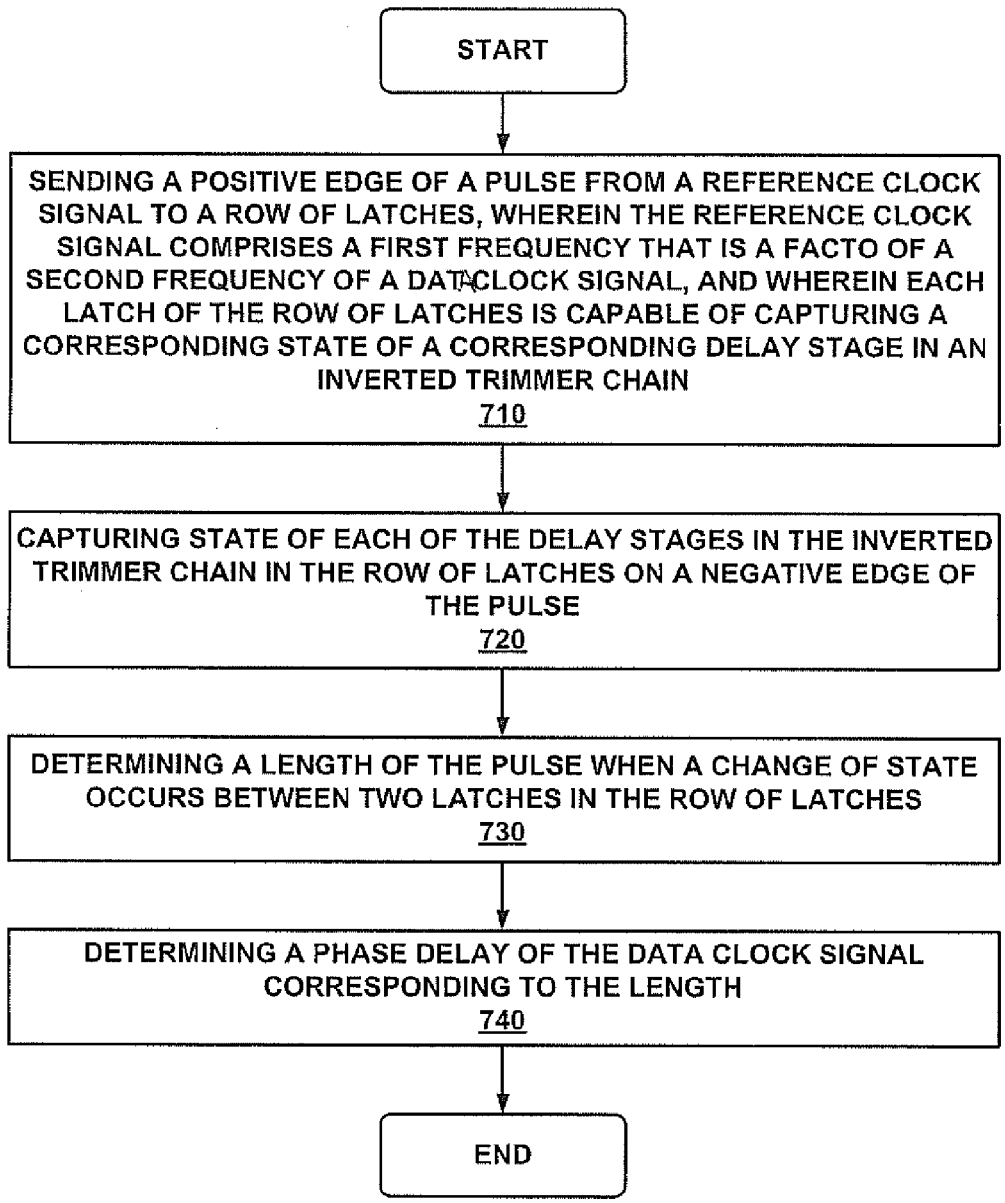
FIG. 7 is a flow chart of computer implemented steps for performing dynamic trimming, in accordance with one embodiment of the present invention.

FIG. 7 is a flow chart 700 illustrating steps in a computer implemented method for performing dynamic trimming of a data clock signal in a LP-DDR memory interface, in accordance with one embodiment of the present invention. The operations performed in flow chart 700 are implemented by the systems presented in FIGS. 2, 3A, 3B, and 5, in one embodiment.

At 710, the input block 340 sends a positive edge of a pulse from a reference clock signal to a row of latches. The positive edge opens each of the latches. The reference clock signal comprises a frequency that is a factor of a frequency of a data clock signal. Each latch is capable of capturing a corresponding state of a corresponding and coupled delay stage in an inverted trimmer chain.

At 720, the input block 340 simultaneously sends the positive edge to the trimmer chain. The positive edge of the pulse then propagates down the delay stages of the trimmer chain. The length of the pulse can be approximately determined by calculating the number of delay stages the positive edge of the pulse had propagated through.

At 730, the row of latches 320 captures the state of each of the delay stages in the trimmer chain. In particular, the negative edge of the pulse is sent in parallel to the row of latches and the trimmer chain. Once the negative edge of the pulse is received by the row of latches, each of the latches closes and captures the state of the coupled and corresponding delay stage.

At 740, the phase length detector 230 of FIG. 2 determines the length of the pulse at a point, or link between two delay stages, when a change of state occurs between two latches in the row of latches. Prior to the point, the states of the delay stages are a high, value showing the propagation of the positive edge of the pulse. After the point, the captured states of the delay stages should be at a common low level, as previously described.

At 750, a transformation module 240 of FIG. 2 determines a phase delay of the data clock signal that corresponds to the calculated length of the pulse. In one embodiment, the trimming of the data clock signal, or read strobe, from the DDR memory should aim for a delay near to a quarter phase of the data clock signal, since that would center the read strobe precisely between both edges of the data.

Periodic Counters for Scheduling Events

Figure 8:
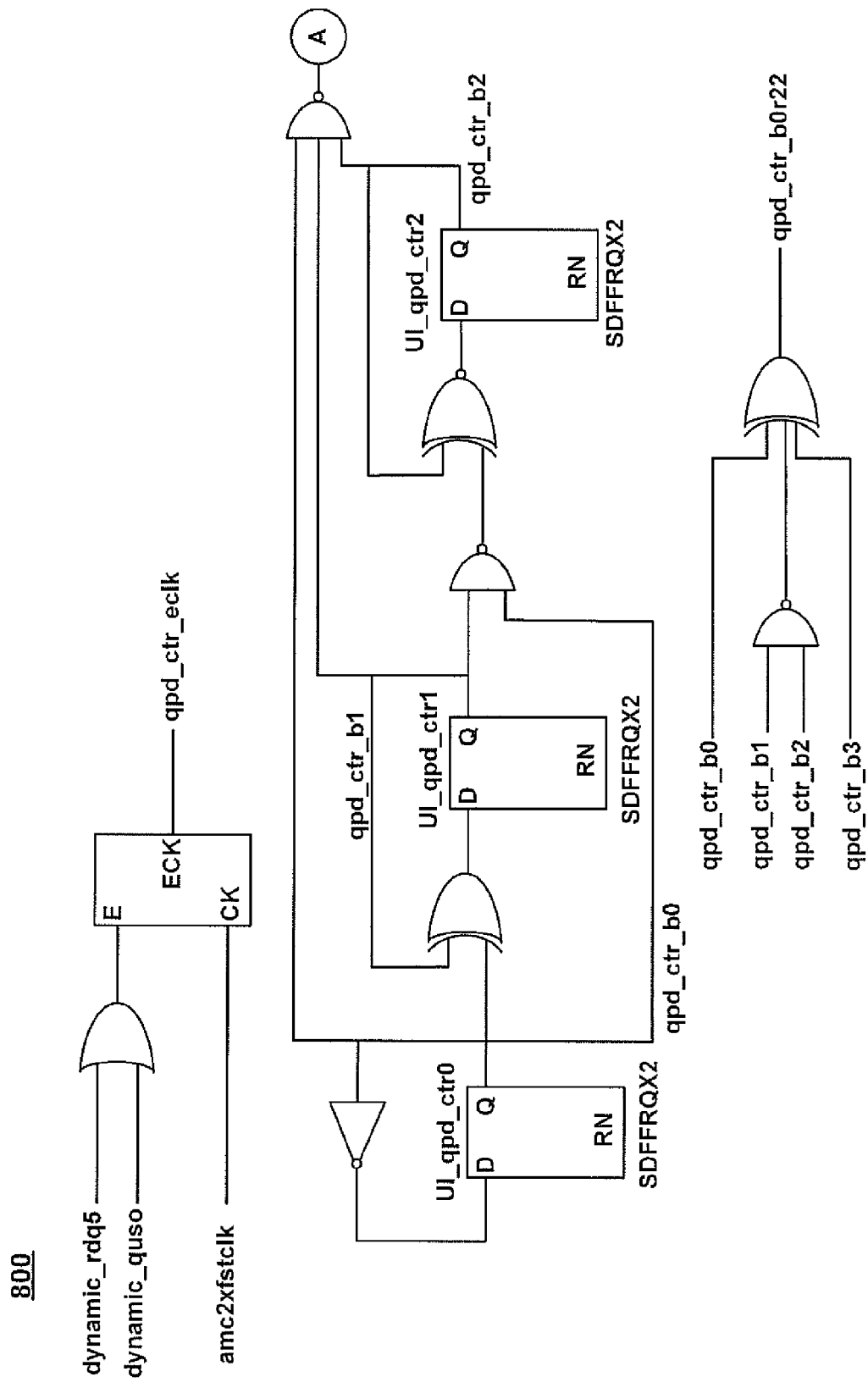
FIG. 8 is a schematic diagram of a periodic counter circuit used for scheduling events, in accordance with one embodiment of the present invention.
Figure 8:
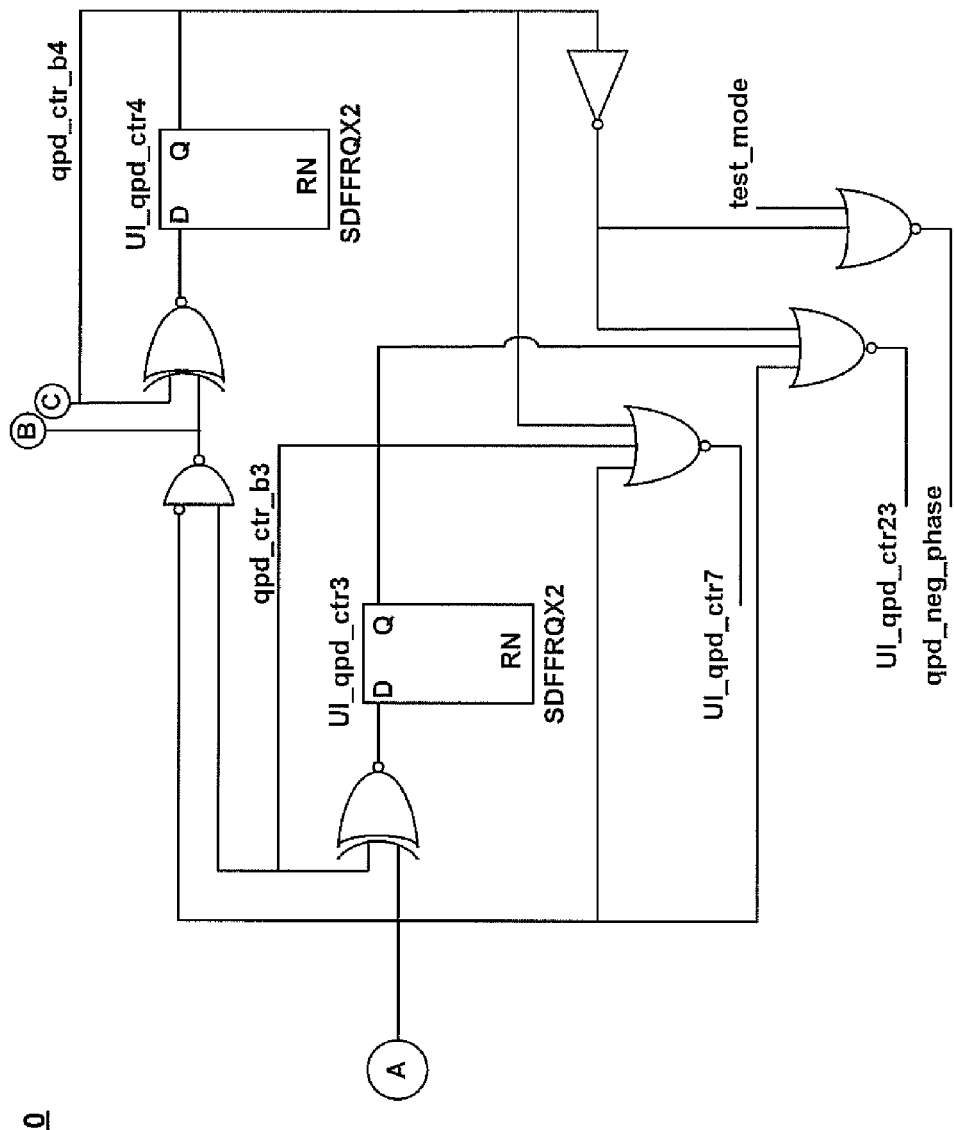
Figure 8:
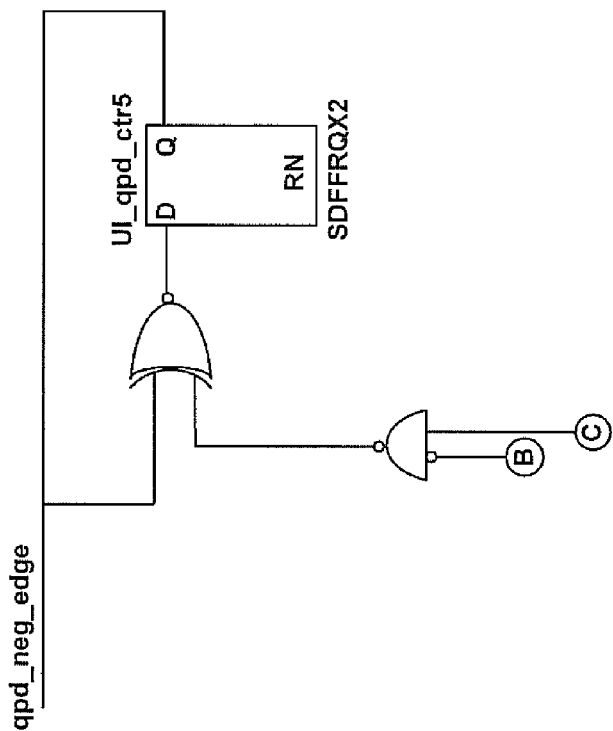

FIG. 8 is a diagram of a periodic counter circuit 800 used for scheduling events, in accordance with one embodiment of the present invention. The periodic counter 800 is used for generating a slower frequency clock from a reference clock, using the positive and negative phases and both positive and negative edges of a pulse in a delay chain to estimate delays of a data clock signal from a DDR memory interface. Specifically, the output of the counter 900B is used to drive a delay chain mimicking the trimmer, in embodiments of the present invention.

The counter 800 operates when the rdqs and quse trimmer are operating in the dynamic mode, in one embodiment. In another embodiment, a static operation is also possible. In addition, the clock gating latch saves power by turning off the clock entirely when dynamic updates are not selected.

The counter 800, at every 16 cycles generates a pulse to indicate whether a pulse for the positive or negative phase of the clock is used to estimate a delay, in accordance with one embodiment of the present invention. At every 32 cycles the counter determines whether a positive edge or negative edge is launched in the delay chain. The counter ensures that all the phase delay calculation circuitry operates at $\frac{1}{16}^{th}$ the frequency of the reference clock signal. The clock frequency could be slower by using an wider counter as the one shown in FIG. 8, in another embodiment.

Even Values Operation

In embodiments of the present invention, even value operation for trimming the data clock signal from the DDR memory is possible. Even value operation allows circuit designs using approximately half the hardware circuitry to enable dynamic trimming of the data clock signal. For instance, in FIGS. 9A-9D components including a dynamic trimmer, counter, phase length detector, and phase position detection circuits are shown and can be implemented using less circuit components than more complex embodiments using both even and odd trimmer taps.

Figure 9A:
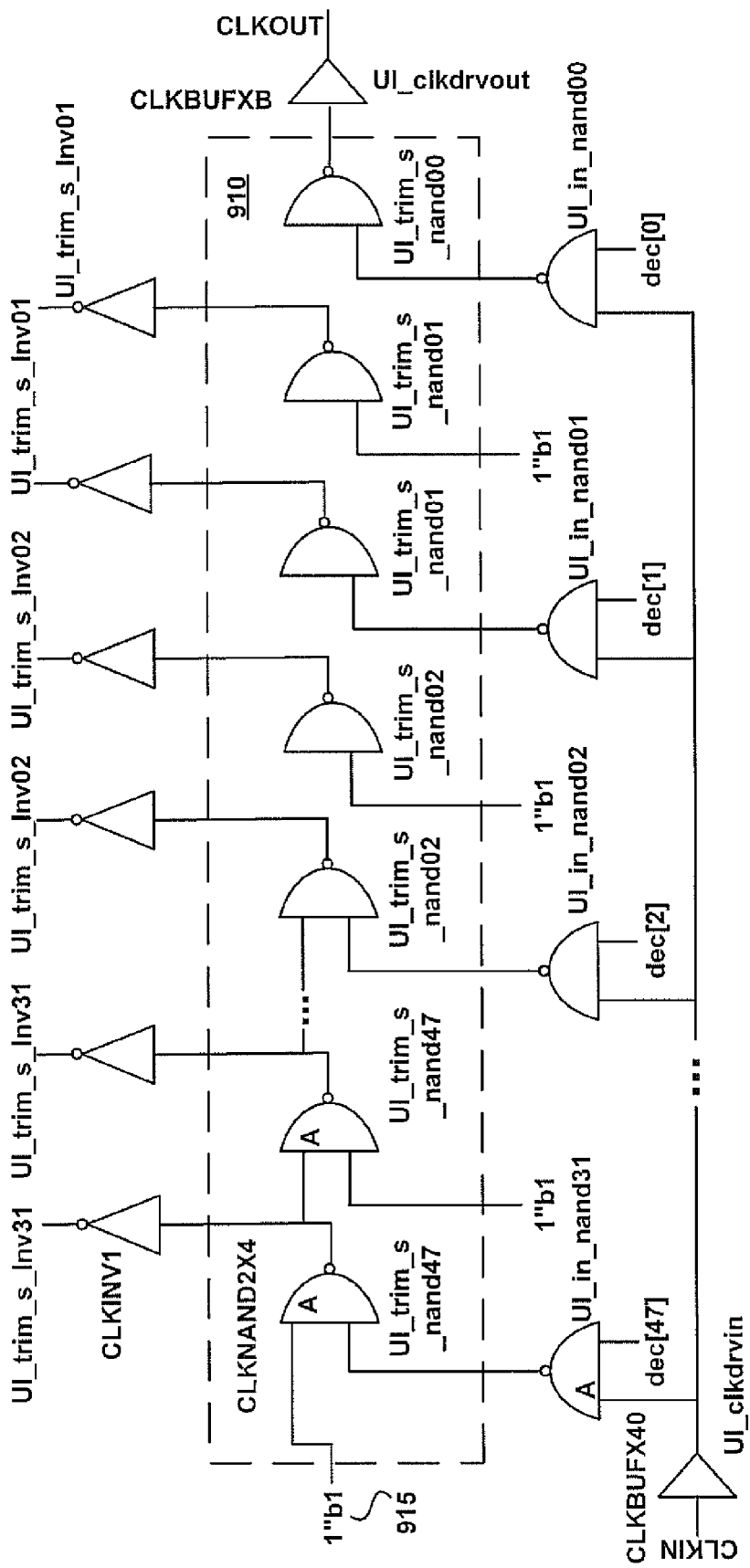
FIG. 9A is a schematic diagram of a trimmer circuit in which even values are used to calculate and implement a phase delay on a data clock signal from a DDR memory interface is shown, in accordance with one embodiment of the present invention.

As shown in FIG. 9A, a diagram of a trimmer circuit 900A in which even values are used to calculate and implement a phase delay on a data clock signal from a DDR memory interface is shown, in accordance with one embodiment of the present invention. In the present embodiment, should the granularity of 2 NAND gate delays be small enough, a more basic trimmer can be implemented by restricting dynamic trim values to even values.

Trimmer circuit 900A has a selectable input (e.g., odd, even, etc.) to delay chain 910 that may correspond to even select inputs of finer grain trimmers (e.g., 600A). In one embodiment, the selectable input may be a constant high (e.g., 1′*b*1) where the trimmer (e.g., 900A) has an odd number of gates (e.g., 47 pairs of NAND gates plus an initial NAND gate labeled "nand00" for a total of 95 NAND gates).

The delay of a single NAND gate is rather small, and therefore, the trimmer of FIG. 9A may be sufficient for most LP-DDR applications. In particular the trimmer 900A can dynamically change select values when the input CLKIN is 0 without requiring any protective circuitry at the output of the trimmer circuit.

As shown in FIG. 9A, each NAND gate in the delay chain 910 sees the same dummy inverter so that all gates see the same capacitance under rise and fall conditions. Since the various select values share the same chain of NAND gates, incrementing the select value reliably increases the trimmer delay.

Figure 9B:
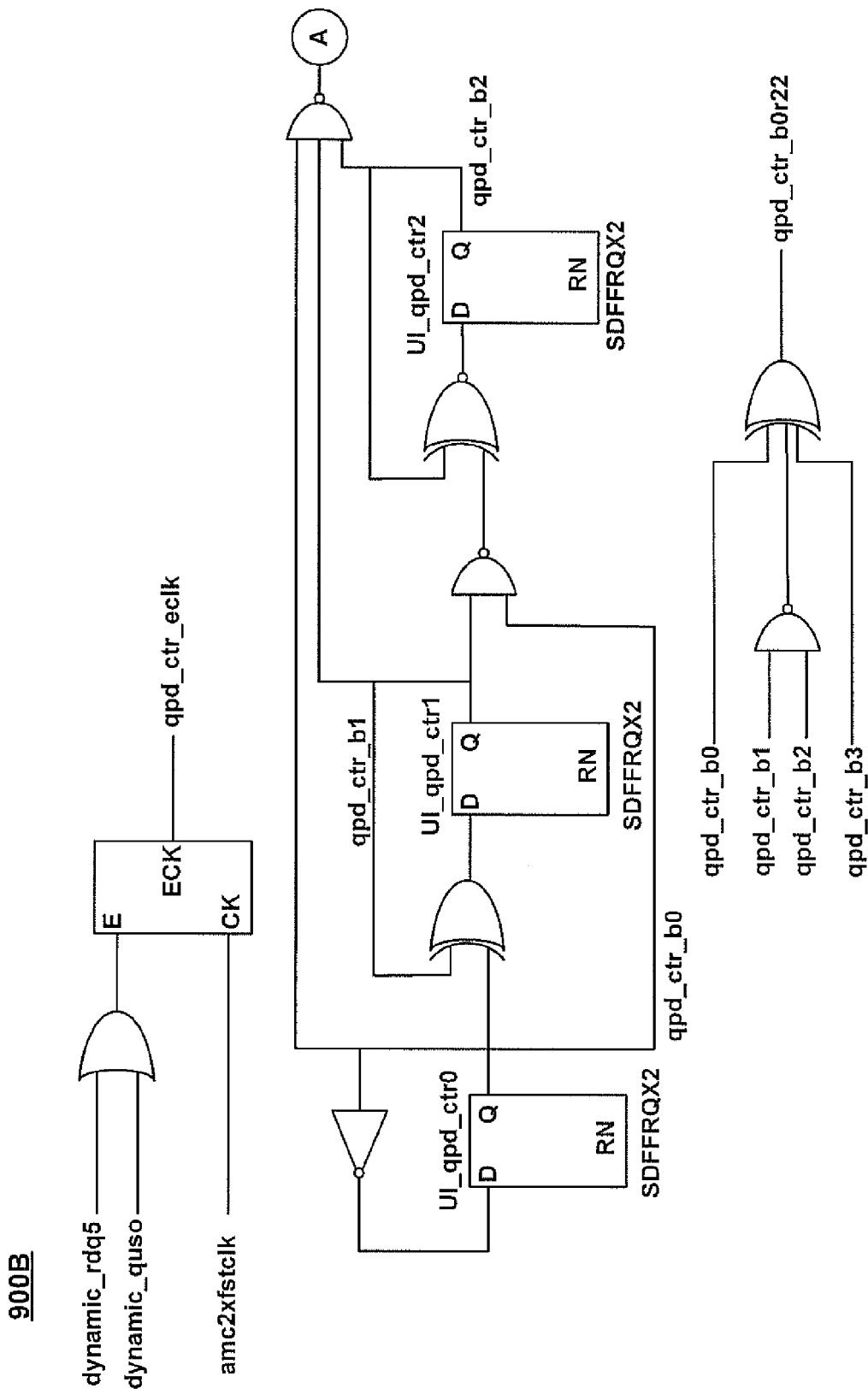
FIG. 9B is a circuit diagram for a counter used for even operation, in accordance with one embodiment of the present invention.
Figure 9B:
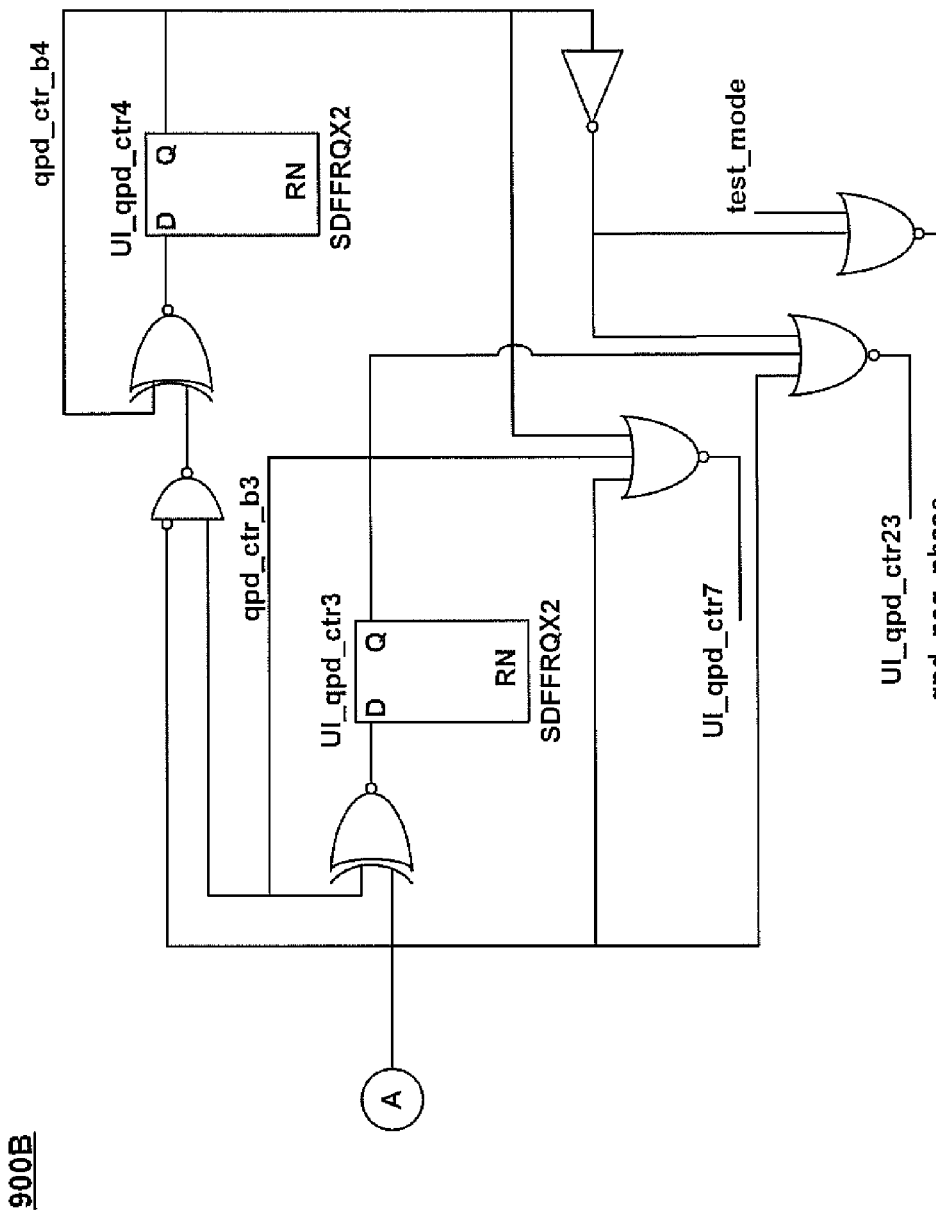
Figure 9C:
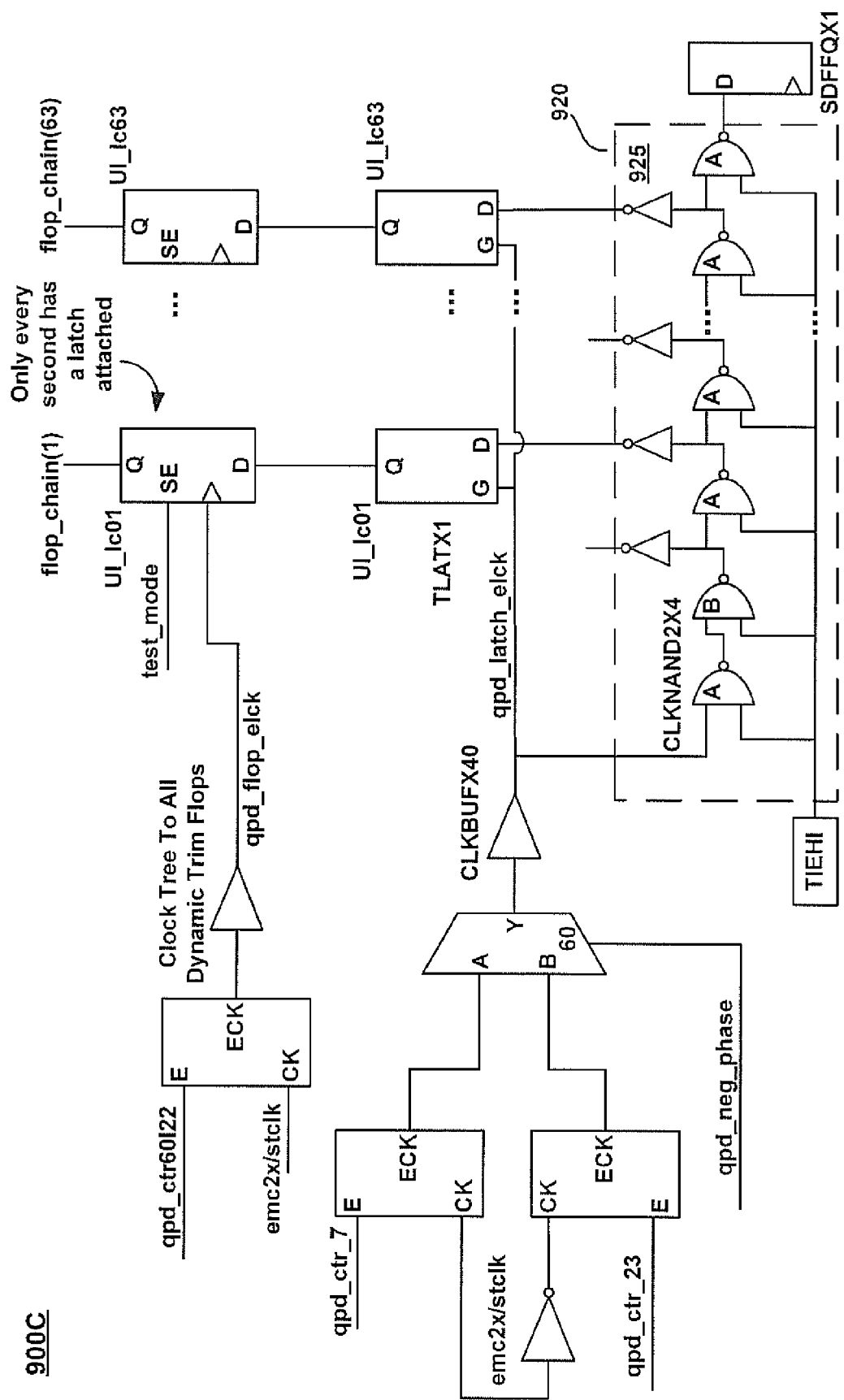
FIG. 9C is a circuit diagram for a phase length detector used for even operation, in accordance with one embodiment of the present invention.

In FIG. 9B, a circuit diagram is shown for counter 900B used for even operation, in accordance with one embodiment of the present invention. The counter 900B contains less hardware because the inversions at each stage of the trimmers assumes that the positive edge and negative propagation of positive edge and negative edge in the trimmer chain is almost equal in delay.

In its simplified version, the counter 900B loses its most significant bit of controlling edge information. The output of counter 900B is used to drive a delay chain mimicking the trimmer, in embodiments of the present invention.

In FIG. 9C, a circuit diagram is shown for a phase length detector 900C used for even operation, in accordance with one embodiment of the present invention. In the present embodiment, the phase length detector 900C only concentrates on changing from even values to even values (or odd values to odd values). As such, the design of the phase length detector 900C can further be reduced from the detector 300A and 300B of FIGS. 3A and 3B by eliminating half the latches and half the gates, in one embodiment.

In FIG. 9C, the odd values are retained in the latch chain and an even value is determined by observing the point between two odd latches. As shown in FIG. 9C, the same inverters (e.g., 925) in the trimmer 920 are used as in the dynamic trimmers, producing the same capacitive load at each delay stage of the trimmer 920.

Edge Position Detection

Figure 10A:
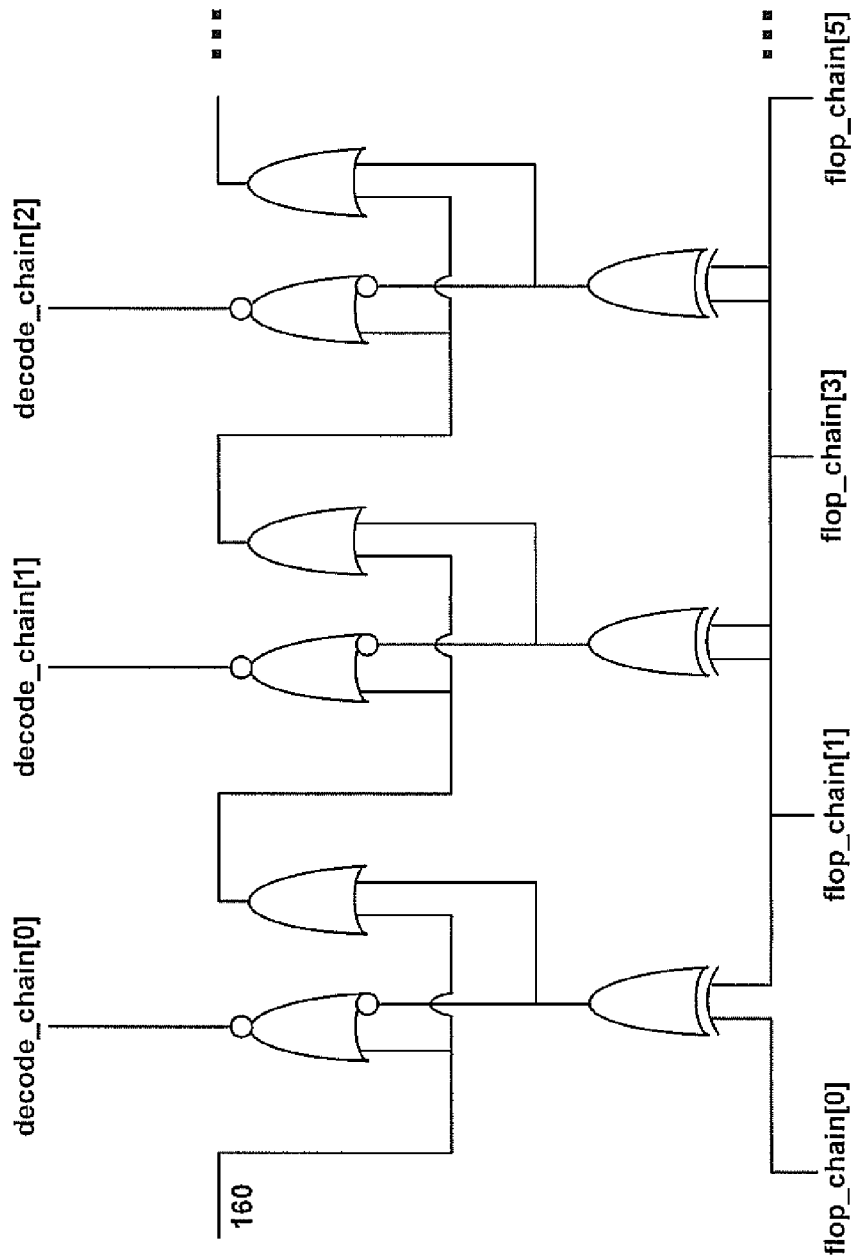
FIG. 10A is a circuit diagram of an edge position detector that is used for detecting the position of edges of a pulse, in accordance with embodiments of the present invention.
Figure 10A:
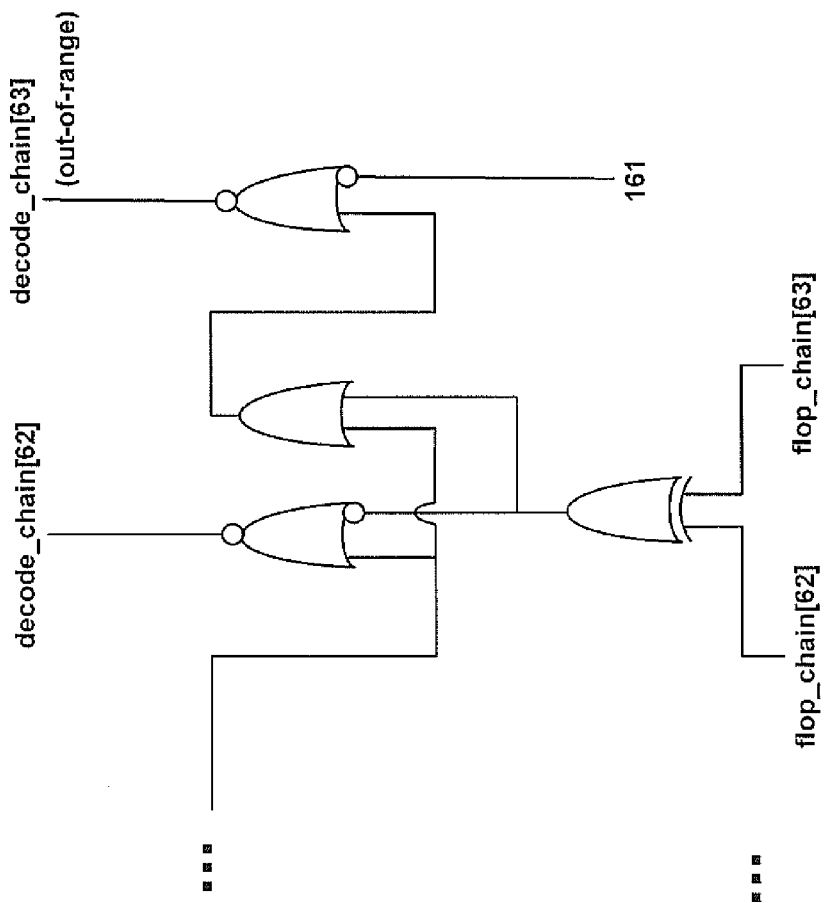
Figure 10B:
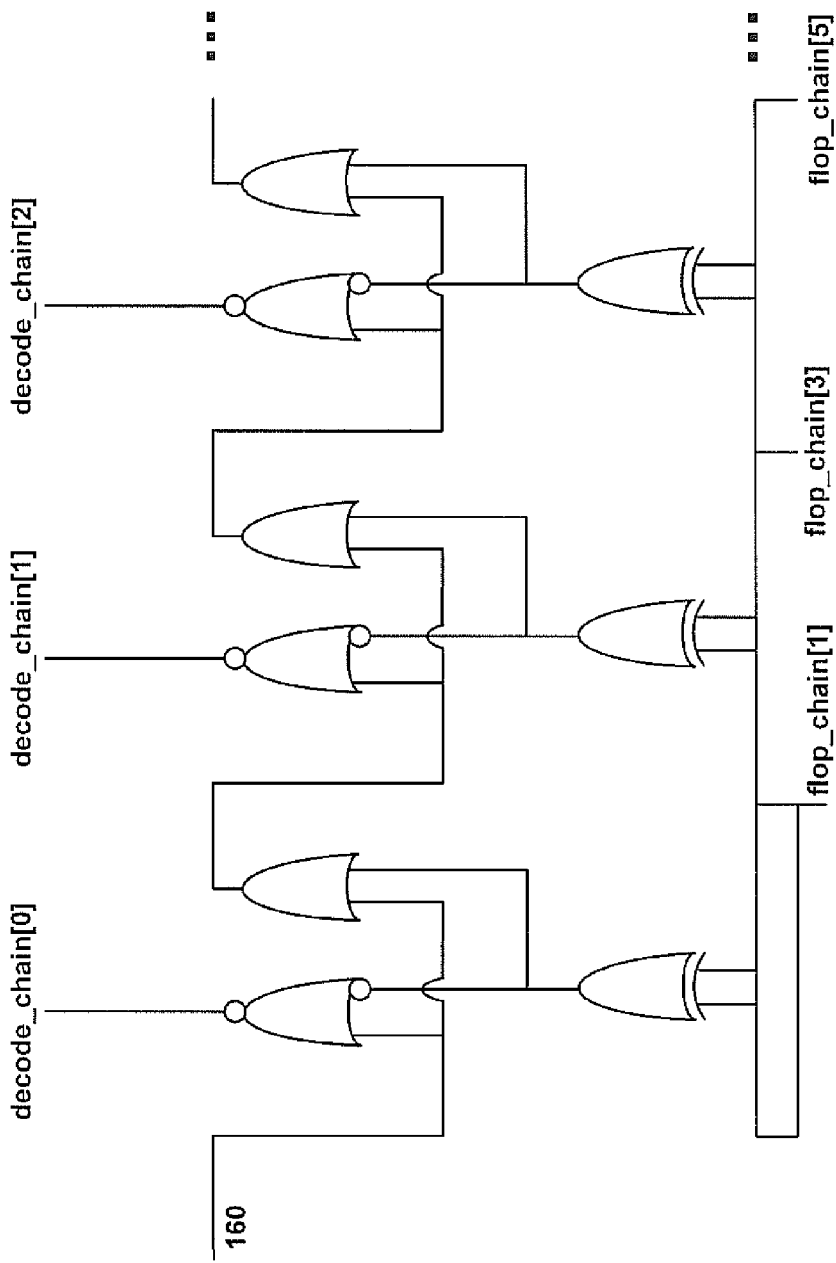
FIG. 10B is a circuit diagram of an edge position detector that is used for detecting phase position detection used for even trimming operation, in accordance with one embodiment of the present invention.
Figure 10B:
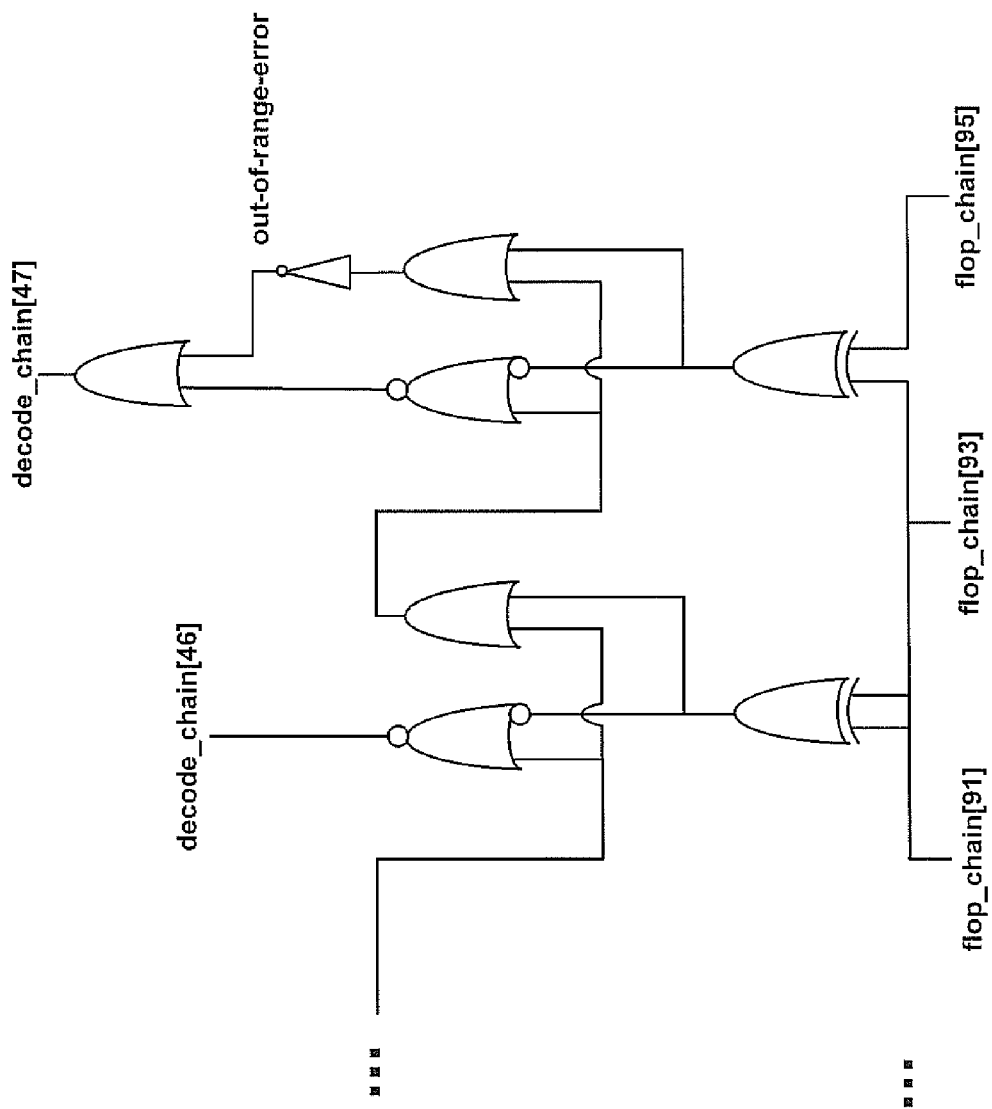

FIGS. 10A and 10B are circuit diagrams of edge position detectors 1000A and 1000B, respectively, that are used for detecting the position of edges of a pulse, in accordance with embodiments of the present invention.

For instance, FIG. 10A shows an edge position detector 1000A, in accordance with one embodiment of the present invention. The circuit of FIG. 10A ensures that the output has at least and at most a single bit with a high output, the definition of one hot encoding.

Figure 10C:
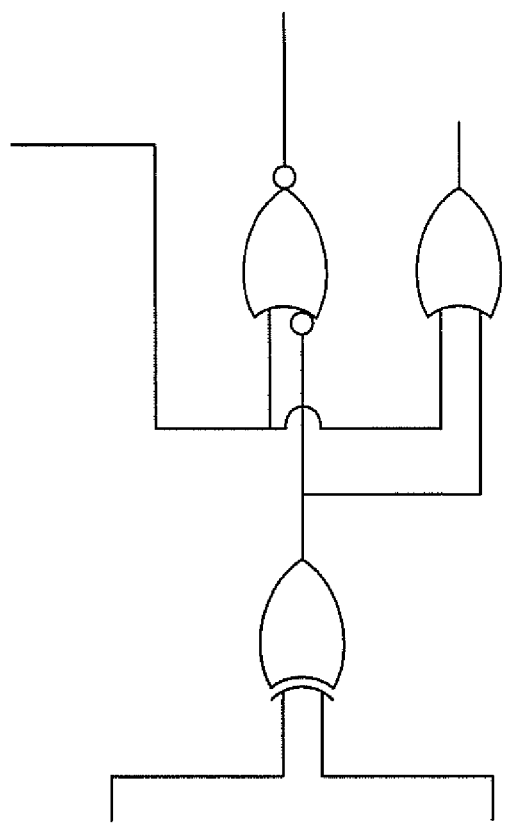
FIG. 10C is a schematic of a cell repeated in the edge position detection circuits of FIGS. 10A and 10B, in accordance with one embodiment of the present invention.

Turning now to FIG. 10B, when only using even values for phase length detection, then the edge position detector 1000B can be further reduced in terms of hardware component design. The edge position detector 1000B is more economical in that it produces requires half the hardware at the expense of trimmer granularity. In another embodiment, both designs of the edge position detectors 1000A and 1000B use the same cell 1000C repeated multiple times, in embodiments as shown in FIG. 10C.

Figure 11B:
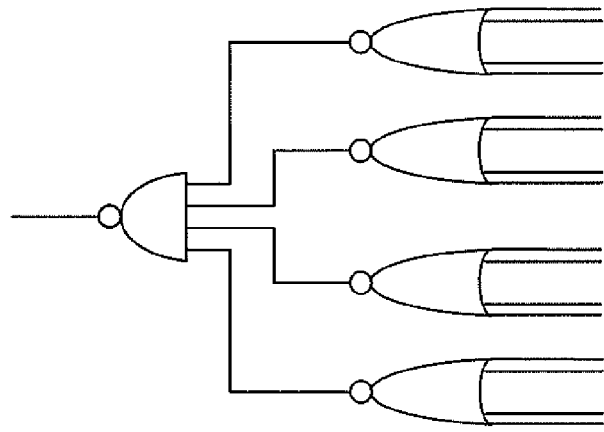
FIG. 11B is a schematic of a generic encoder bit design for a 32×5 encoder, in accordance with one embodiment of the present invention.
Figure 11A:
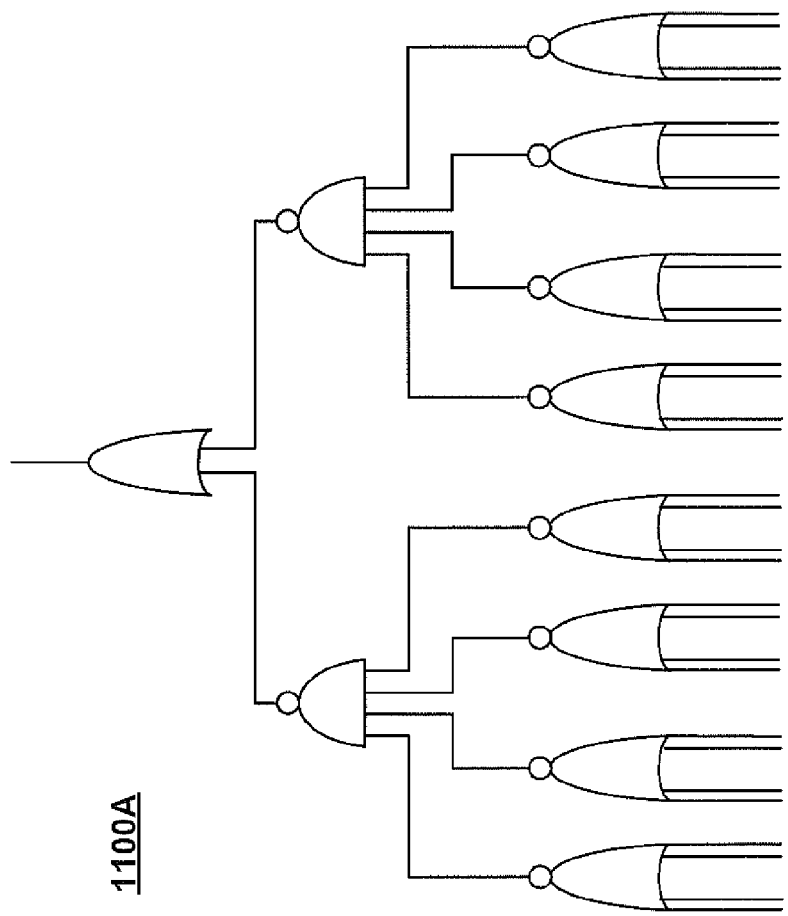
FIG. 11A is a schematic of a generic encoder bit design for a 64×6 encoder, in accordance with one embodiment of the present invention.

In accordance with other embodiments of the present invention, the one hot encoding is then translated to a binary number using a simple encoder. Some example structures for encoding are shown in FIGS. 11A and 11B. For instance, the encoder 1100A in FIG. 11A illustrates an encoder bit design for a 64×6 encoder. Also, the encoder 1000B in FIG. 11B illustrates an encoder bit design for a 32×5 encoder.

Linear Transformation and Averaging

The linear transformation and the averaging performed in block 240 of FIG. 2 and blocks 550, 555 and 540 of FIG. 5 can be accomplished using multipliers, in accordance with one embodiment of the present invention. Multipliers are implemented within a small area by using 4:2 compressor cells, in one embodiment. Specifically, in one embodiment, a maximum numerator of 23 for coefficients "A and a" is chosen since this limits the number of partial products to four. Furthermore, there is no anticipated need for delay longer than a quarter phase of the DDR clock.

Figure 12:
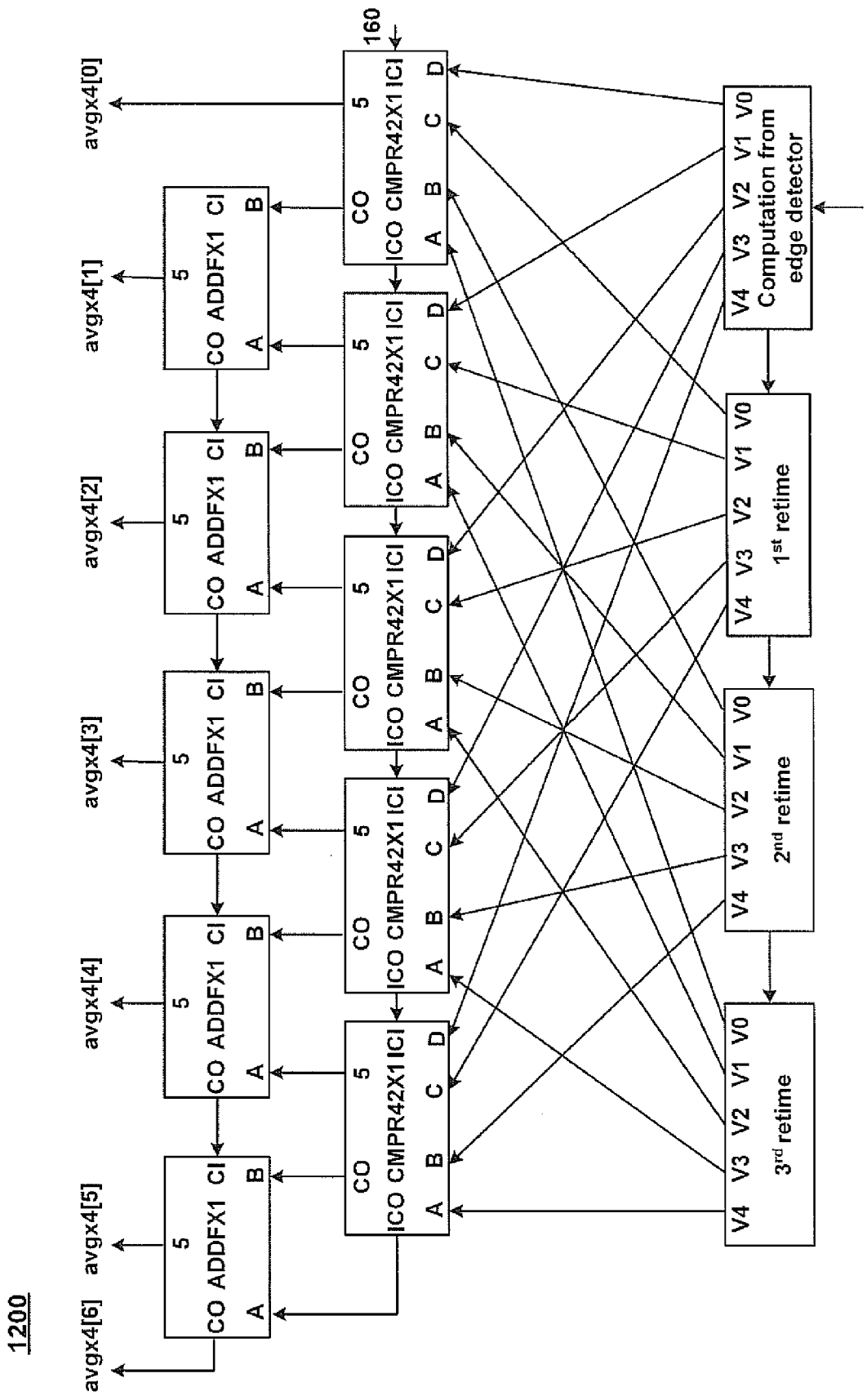
FIG. 12 shows an adder circuit that is capable of averaging numbers, in accordance with one embodiment of the present invention.

FIG. 12 shows an adder circuit 1200 that is capable of averaging numbers using half adders, full adders and compressor cells to produce a small design adding four numbers of 5 bits each, in accordance with one embodiment of the present invention. The present embodiment, is used for a trimmer with 32 positions.

In another embodiment, the linear transformation unit is designed using similar structures and cells. In one embodiment, if more values are averaged out, then a side value can be registered to keep track of the accumulated count. When a new value emerges, the oldest value can be subtracted and the new value added. Such a structure is not needed when limited to averages of four samples, in another embodiment.

Alternatively, the entire design can be synthesized to optimize the gates from the position detector all the way to the linear transformation, in accordance with one embodiment of the present invention. The output of the linear transformations are flopped and selectively used to change the trimmer values when no read is occurring.

Because of the linear transformation, one embodiment is capable of updating the quse trimmer to a desirable fraction of the clock period (using coefficient A) and shift it by some arbitrary number of positions (using offset B). This provides a PVT robust means of adapting to the possibly large tAC variance in LP-DDR mobile applications.

Embodiments of the present invention dynamically track delays using low power and die area, provide for the presence of scalable delays, provide metastability robustness at low area cost, and provide a design option to change the tap point of a low area trimmer with inverting stages while not causing glitches. The solutions of the present embodiments address the high variance of LP-DDR return read data in the absence of power consuming DLLs. Finally, the designs address the duty cycle distortion of the signal used as a reference in generating delays.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

What is claimed is:

1. A system for performing dynamic trimming, comprising:
    a clock for generating a reference clock signal, wherein said reference clock signal comprises a first frequency that is a factor of a second frequency of a signal;
    a counter coupled to said clock for generating a plurality of clock pulses based on pulses of said reference clock signal, wherein said plurality of clock pulses is generated at a slower frequency from said first frequency;
    a phase length detector coupled to said counter comprising a trimmer chain for detecting a length of at least one of said plurality of clock pulses; and
    a transformation module coupled to said phase length detector for transforming said length to a phase delay applied to said signal.

2. The system of claim 1, wherein said factor is two, such that said first frequency of said reference clock signal is twice said second frequency of said signal, such that said length is equal to approximately one quarter of a phase of said signal.

3. The system of claim 1, wherein said plurality of clock pulses comprises:
    a positive phase and positive edge of said reference clock signal;
    a negative phase and positive edge of said reference clock signal;
    a positive phase and negative edge of said reference clock signal; and
    a negative phase and negative edge of said reference clock signal.

4. The system of claim 1, wherein said phase length detector comprises:
    a row of latches for opening on a rising edge and closing on a falling edge of one of said plurality of clock pulses;
    a trimmer coupled to said row of latches comprising a plurality of delay stages for determining propagation of said rising edge through said trimmer at a point when said falling edge is propagated through said row of latches.

5. The system of claim 4, wherein said row of latches comprises a plurality of alternating inverting latches coupled to said plurality of delay stages, such that said length is determined where two neighboring latches have different output values.

6. The system of claim 1, wherein said transformation module comprises:
    an adder for averaging a plurality of lengths determined from said plurality of clock pulses; and
    a linear transformation module for performing said transforming an average of said plurality of lengths to said phase delay.

7. The system of claim 1, wherein said transformation module performs operations transforming said length to a phase delay of said signal that comprises a data clock signal.

8. The system of claim 1, wherein said transformation module performs operations transforming said length to a phase delay of said signal that comprises a window used for determining when read data is valid.

9. The system of claim 1, further comprising:
    a trimmer for trimming a signal by said phase delay.

10. A system for performing dynamic trimming, comprising:
    a trimmer chain for receiving at least one pulse from a reference clock signal, wherein said trimmer comprises a plurality of delay stages for determining propagation of a rising edge of a pulse through said trimmer, wherein said trimmer chain closely approximates a trimmer chain used for trimming said data clock signal;
    a row of latches for capturing states of delay stages in said plurality of delay stages, wherein propagation of said rising edge through said trimmer is determined at a point in said trimmer when a falling edge of said pulse is propagated through said row of latches, wherein said point corresponds to a length of said pulse;
    an adder for averaging a plurality of lengths determined from said at least one pulse;
    a linear transformation module for transforming an average length of said plurality of lengths to a phase delay of said data clock signal; and
    a trimmer for trimming said data clock signal by said phase delay.

11. The system of claim 10, wherein said row of latches numbers half the plurality of delay stages to capture even values of said plurality of delay stages.

12. The system of claim 10, wherein pulses of said at least one pulse is generated every 16 cycles of said reference clock signal for low power operation, and wherein said at least one pulse that is averaged comprises:
    a positive phase and positive edge of said reference clock signal;
    a negative phase and positive edge of said reference clock signal;
    a positive phase and negative edge of said d reference clock signal; and
    a negative phase and negative edge of said reference clock signal.

13. A method for performing dynamic trimming, comprising:

sending a positive edge of a pulse from a reference clock signal to a row of latches, wherein said reference clock signal comprises a first frequency that is a factor of a second frequency of a signal, and wherein each latch of said row of latches is capable of capturing a corresponding state of a corresponding delay stage in a trimmer chain;

simultaneously sending said positive edge to said trimmer chain;

capturing state of each of said delay stages in said inverted trimmer chain in said row of latches on a negative edge of said pulse;

determining a length of said pulse when a change of state occurs between two latches in said row of latches; and determining a phase delay of said signal corresponding to said length.

14. The method of claim 13, further comprising:
setting said first frequency to twice said second frequency, such that said phase delay is one quarter phase of said signal.

15. The method of claim 13, further comprising:
performing an AND operation on a window signal indicating when read data is valid and a read strobe signal from a memory to determine a sampling clock; and
trimming said sample clock by said phase delay using a trimmer closely represented by said trimmer chain.

16. The method of claim 13, further comprising:
sending at least one more pulse from said reference clock signal at a reduced frequency from said first frequency for low power operation to determine corresponding lengths of said at least one more pulse; and
averaging said length and said corresponding lengths to determine an average of said phase delay.

17. The method of claim 16, wherein said sending at least one more pulse comprises:
reducing jitter by sending a negative edge of a positive phase of said reference clock signal, wherein said positive edge of said pulse comprises said positive phase.

18. The method of claim 16, wherein said sending at least one more pulse comprises:
reducing duty cycle distortion by sending a positive edge of an inverted negative phase of said reference clock signal, wherein said positive phase of said pulse comprises a positive phase of said reference clock signal.

19. The method of claim 16, further comprising:
sending pulses in said at least one more pulse at prime number intervals of cycles of said first frequency to reduce harmonic jitter.

20. The method of claim 13, wherein said signal comprises a data clock signal.

* * * * *